(12) United States Patent
Adams et al.

(10) Patent No.: US 6,225,639 B1
(45) Date of Patent: May 1, 2001

(54) METHOD OF MONITORING A PATTERNED TRANSFER PROCESS USING LINE WIDTH METROLOGY

(75) Inventors: Thomas E. Adams, Orlando; Thomas S. Frederick, St. Cloud; Scott Jessen, Orlando; John M. McIntosh, Orlando; Catherine Vartuli, Orlando, all of FL (US)

(73) Assignee: Agere Systems Guardian Corp., Miami Lakes, FL (US)

( * ) Notice: Subject to any disclaimer, the term of this patent is extended or adjusted under 35 U.S.C. 154(b) by 0 days.

(21) Appl. No.: 09/384,459

(22) Filed: Aug. 27, 1999

(51) Int. Cl.[7] .................................................. G01N 21/86
(52) U.S. Cl. ..................................... 250/559.4; 250/559.3
(58) Field of Search .......................... 250/559.4, 559.3, 250/559.22, 559.44, 234, 235, 548, 306, 307; 356/237.4, 237.5, 399–401; 438/14, 16, 9, 7

(56) References Cited

U.S. PATENT DOCUMENTS

| | | | |
|---|---|---|---|
| 4,600,839 | 7/1986 | Ichihashi et al. ..................... | 250/310 |
| 4,751,384 | 6/1988 | Murakoshi et al. .................. | 250/310 |
| 4,767,926 | 8/1988 | Murakoshi et al. .................. | 250/310 |
| 5,807,761 | * 9/1998 | Coronel et al. ......................... | 438/14 |

* cited by examiner

Primary Examiner—Que T. Le
(74) Attorney, Agent, or Firm—Allen, Dyer, Doppelt, Milbrah & Gilchrist, P.A.

(57) ABSTRACT

A patterned transfer process in the manufacture of a semiconductor device is monitored. Patterned features formed on a semiconductor layer to be etched are scanned for generating a first amplitude modulated waveform intensity signal. The first amplitude modulated waveform intensity signal is sampled to extract a first measurement population of critical dimension measurements. The patterned features are etched and then scanned for generating a second amplitude modulated waveform intensity signal. The second amplitude modulated waveform intensity signal is then sampled to extract a second measurement population of critical dimension measurements, which are then cross-correlated to obtain correlation values of the etching process.

21 Claims, 27 Drawing Sheets

WELL TUNED

POORLY TUNED

T-TOP PR

NOMINAL PR

POSITIVE STEPPER FOCUS. TREND TOWARD THICKNESS REDUCTION.

FIG. 31A
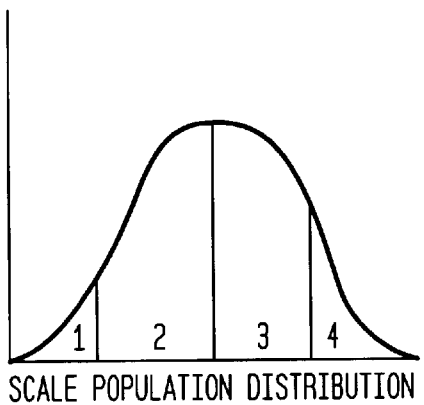
SCALE POPULATION DISTRIBUTION
FIG. 31B
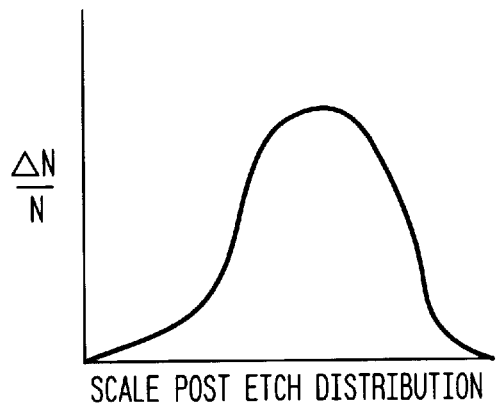
SCALE POST ETCH DISTRIBUTION
FIG. 32A
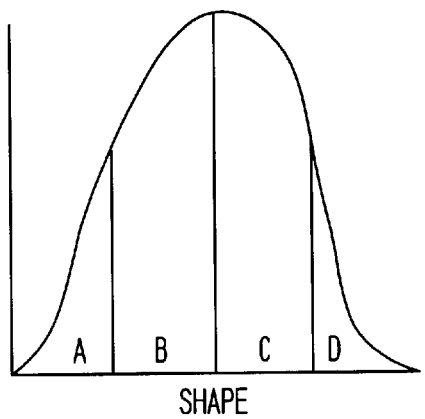
SHAPE
FIG. 32B
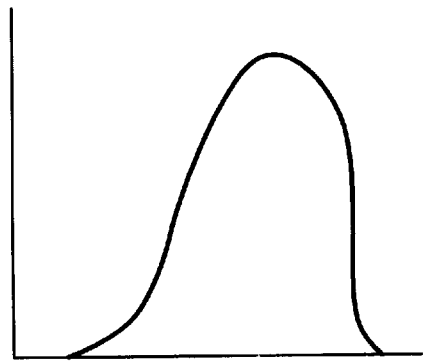
FIG. 33
|   | 1  | 2  | 3  | 4  |
|---|----|----|----|----|
| A | A1 | A2 | A3 | A4 |
| B | B1 | B2 | B3 | B4 |
| C | C1 | C2 | C3 | C4 |
| D | D1 | D2 | D3 | D4 |

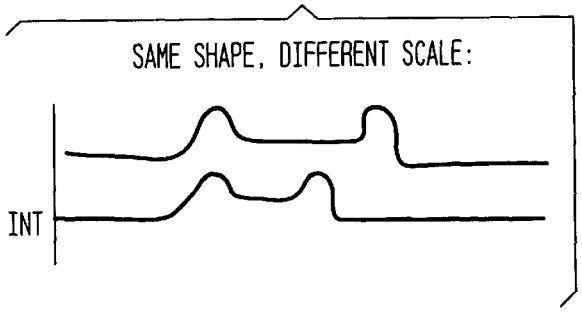
FIG. 53 — SAME SHAPE, DIFFERENT SCALE:
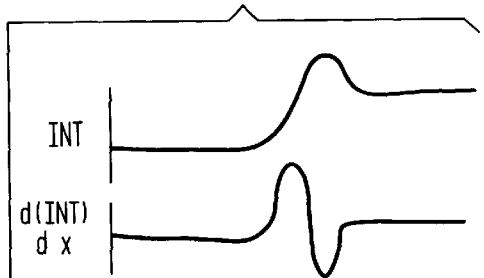
FIG. 55
CORRELATION BY DERIVITIVE EMPHASIZES SLOPE AND TRANSITIONS. REDUCES TOOL DIFFERENCES. AMPLITUDE MAY BE NORMALIZED OR NOT WITH DIFFERENT EMPHASIS ON SLOPE CONTRIBUTION TO SHAPE
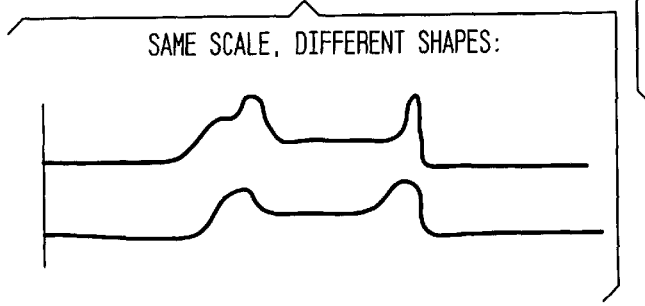
FIG. 54 — SAME SCALE, DIFFERENT SHAPES:
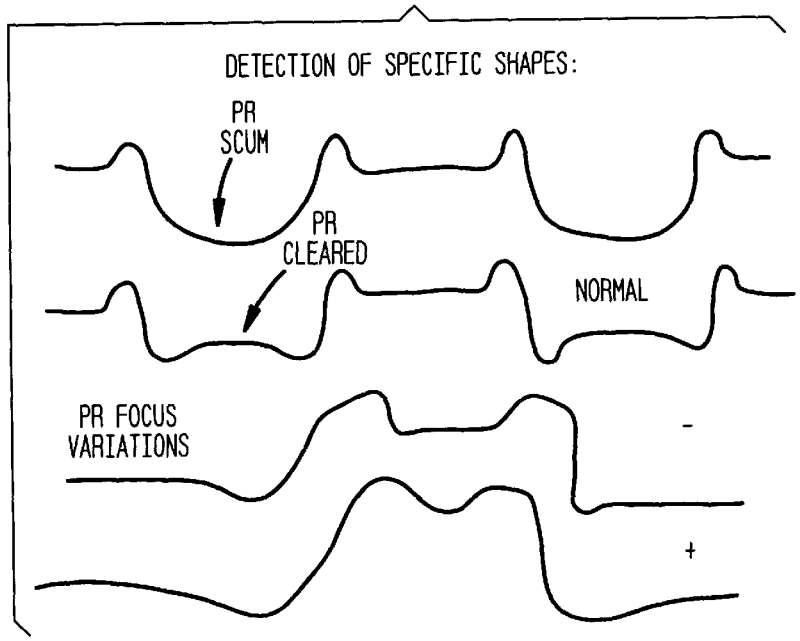
FIG. 56 — DETECTION OF SPECIFIC SHAPES:

METHOD OF MONITORING A PATTERNED TRANSFER PROCESS USING LINE WIDTH METROLOGY

FIELD OF THE INVENTION

This invention relates to the field of semiconductor manufacturing, and more particularly, this invention relates to the field of analyzing a semiconductor surface using line width metrology for monitoring a patterned transfer process.

BACKGROUND OF THE INVENTION

Photoresist features are measured using a scanning electron microscope (SEM) or other line width metrology device to determine if the desired feature size is within a specified range. The line width metrology device typically performs a single measurement, which specifies the size or scale at a single point on a feature's vertical wall. This process is often used in integrated circuit manufacturing before performing a patterning step, often a plasma etch, to determine the quality of the photo-lithographic process. If the quality is inadequate, the resist is stripped and the lithography is reworked.

As device features get smaller, this type of evaluation brought about by a scanning electron microscope or other line width metrology device becomes increasingly important. A reworking of lithography processes is costly and limits the efficient use of expensive equipment in semiconductor manufacturing.

Also, in the semiconductor industry, critical dimension metrology is used with the scanning electron microscope or other intensity trace to determine a width before and after an etching process. Typically, a specific algorithm is picked to determine where on the scanning electron microscope trace that forms an amplitude modulated waveform a position is used to determine the two edges that measure the critical dimension. This typically is an arbitrary method associated with increasingly poor predictive capabilities. For example, much of the method could be based on an inspector's intuition or experience. Thus, the predictive capabilities of the metrology are limited by the intuition and experience of the engineer or inspector making the algorithm determination. The predictive value of the comparison of line width between different technologies, fabrication plants and various companies in the industry are limited by the large variation and the choices of etch detection algorithms used by different metrologists in the industry.

SUMMARY OF THE INVENTION

It is therefore an object of the present invention to provide a method of monitoring a patterned transfer process in the manufacture of a semiconductor device that is not limited by the intuition and experience of an engineer making an algorithm determination to determine edges in the critical dimension measurement.

In accordance with the present invention, the method of the present invention monitors a patterned transfer process in the manufacture of a semiconductor device. The method comprises the step of scanning across patterned features formed on a semiconductor layer to be etched for generating a first amplitude modulated waveform intensity signal. The first amplitude modulated waveform intensity signal is sampled to extract a first measurement population of critical dimension measurements. The patterned features are etched. The method further comprises the step of scanning across the etched patterned features for generating a second amplitude modulated waveform intensity signal. The method comprises the step of then sampling the second amplitude modulated waveform intensity signal to extract a second measurement population of critical dimension measurements. The first and second population of critical dimension measurements are then cross-correlated to obtain correlation values of the etching process.

In one aspect of the present invention, the method comprises the step of deriving a curve of outer line width and inner line spacing for the first and second amplitude modulated waveform intensity signals. The method also comprises the step of forming a patterned photoresist layer over a nitride layer that has been formed over a silicon semiconductor layer. The nitride layer is etched to expose a pattern of the silicon semiconductor layer. The etched nitride layer is then scanned for generating the first amplitude modulated waveform intensity signal. In a further aspect of the present invention, the etched silicon semiconductor layer is etched and the patterned silicon semiconductor layer is scanned for generating the second amplitude modulated waveform intensity signal.

In still another aspect of the present invention, the method comprises the step of sampling about ten to about twenty times across the patterned features in about 5% to about 10% increments for obtaining the population of critical dimension measurements. The method also comprises the step of generating first and second amplitude modulated waveform signals with a scanning electron microscope.

In still another aspect of the present invention, the first and second amplitude modulated waveform signals can be generated with a semiconductor stylus measurement tool.

In still another aspect of the present invention, the method can store the correlation values of the etching process within a database for use in monitoring subsequent etching on other samples of other semiconductor layers to be etched. A second semiconductor layer to be etched can also be scanned for generating an amplitude modulated waveform intensity signal of the second semiconductor layer to be etched. The anticipated etching process results can be determined based on the stored correlation values.

BRIEF DESCRIPTION OF THE DRAWINGS

Other objects, features and advantages of the present invention will become apparent from the detailed description of the invention which follows, when considered in light of the accompanying drawings in which:

FIGS. 31A and 31B are graphs showing a photoresist population distribution, and a post etch distribution after adjustment of subsequent etch.

FIGS. 32A and 32B are graphs showing a photoresist shape distribution, and a post etch distribution.

FIG. 33 is a matrix of scale and shape values for a plurality of features, such as shown in the distributions of FIGS. 31A and 32A.

FIG. 53 is a graph illustrating a comparison of an input template and variable signal for a same shape and different scale.

FIG. 54 is a graph illustrating the same scale and different shapes.

FIG. 55 is a graph illustrating a correlation by taking a derivative, which emphasizes the slope and transitions where the amplitude may be normalized.

FIG. 56 is a graph illustrating the detection of specific shapes.

DETAILED DESCRIPTION OF THE PREFERRED EMBODIMENTS

The present invention is advantageous because it now allows a method of monitoring a patterned transfer process in the manufacture of a semiconductor device. The patterned features formed on a semiconductor layer to be etched can be scanned for generating a first amplitude modulated waveform intensity signal. This signal is then sampled to extract a first measurement population of critical dimension measurements. The patterned features are etched and then scanned for generating a second amplitude modulated waveform intensity signal. This second signal is then sampled to extract a second measurement population of critical dimension measurements. The first and second plurality of critical dimension measurements are cross-correlated to obtain correlation values of the etching process. Thus, it is no longer necessary to predict capabilities of metrology based upon the intuition and experience of an engineer making the algorithm determination. The predictive value of comparison of line width between various technologies and fabrication facilities in the industry are no longer limited by the large variation and choices of etch detection algorithms employed by metrologists in the industry.

For purposes of description, a general background begins by describing how the accuracy error in scan signals of a semiconductor line width metrology device is determined. The general background is then followed with a more detailed analysis of the present invention.

Figure 1:
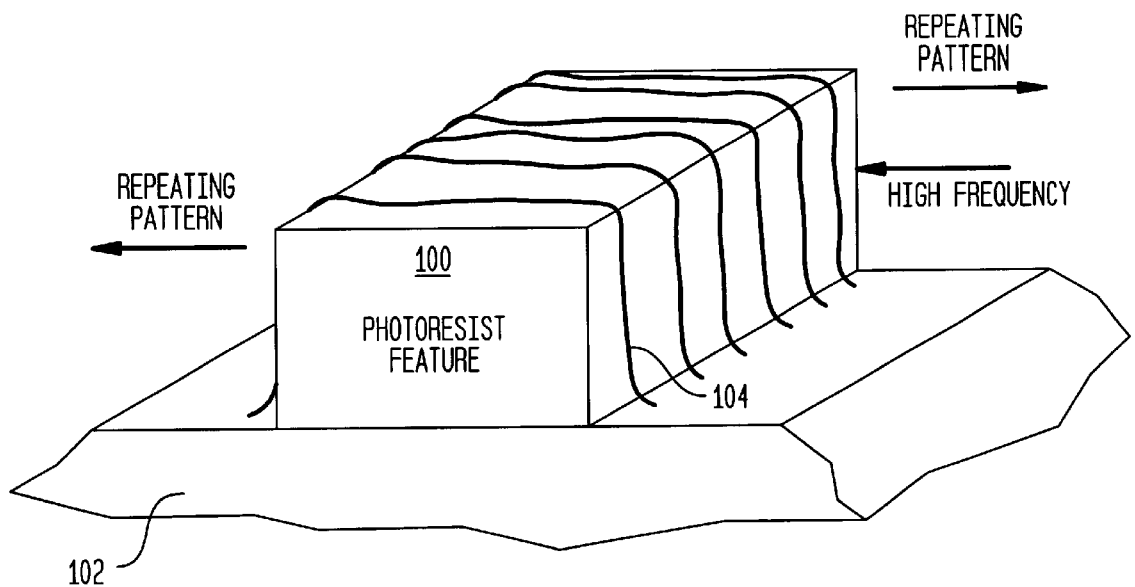
FIG. 1 is a drawing showing an enlarged view of a patterned feature and the amplitude modulated waveform signals relative to the patterned feature.
Figure 2A:
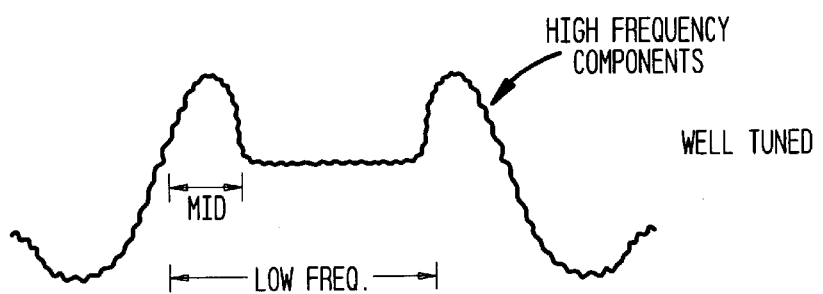
FIGS. 2A and 2B are graphs showing respective well tuned (focused) and poorly tuned (unfocused) amplitude modulated waveform signal produced by a scanning electron microscope.

Referring now to FIG. 1, a patterned feature 100, such as a photoresist feature, is formed on a semiconductor layer 102. As is known to those skilled in the art, a metrology device (such as a scanning electron microscope) can scan the patterned feature (and preferably an entire distribution of features on the surface) and produce a critical dimension parameter of line width. Although the description will follow with reference to a scanning electron microscope, any semiconductor line width metrology device, such as a semiconductor stylus measurement tool, (FIG. 2D), an optical microscope, an atomic force microscope, a focused ion beam and other electron beam microscopes, as known to those skilled in the art, could be used. FIGS. 1 and 2A illustrates the type of amplitude modulated waveform signal 104 that could be produced based on the shape and scale of a patterned feature 100, in this case, a photoresist feature. FIG. 1 shows a plurality of scan lines across the photoresist feature.

Figure 2B:

FIG. 2A illustrates a well tuned waveform signal in the form of the amplitude modulated waveform signal, showing a profile of which the critical dimension line width of the patterned feature could be determined. The electron scanning microscope was well tuned. The waveform signal includes low frequency components corresponding to the central portion of the patterned feature, mid-range frequency components corresponding to the edge portions, and high frequency components corresponding to the very edge. The edge portions have a higher signal intensity and contain the higher frequency components. A poorly tuned scanning electron microscope would produce a waveform signal, such as shown in FIG. 2B, which has a broader shape and attenuated high frequency components.

Figure 2C:
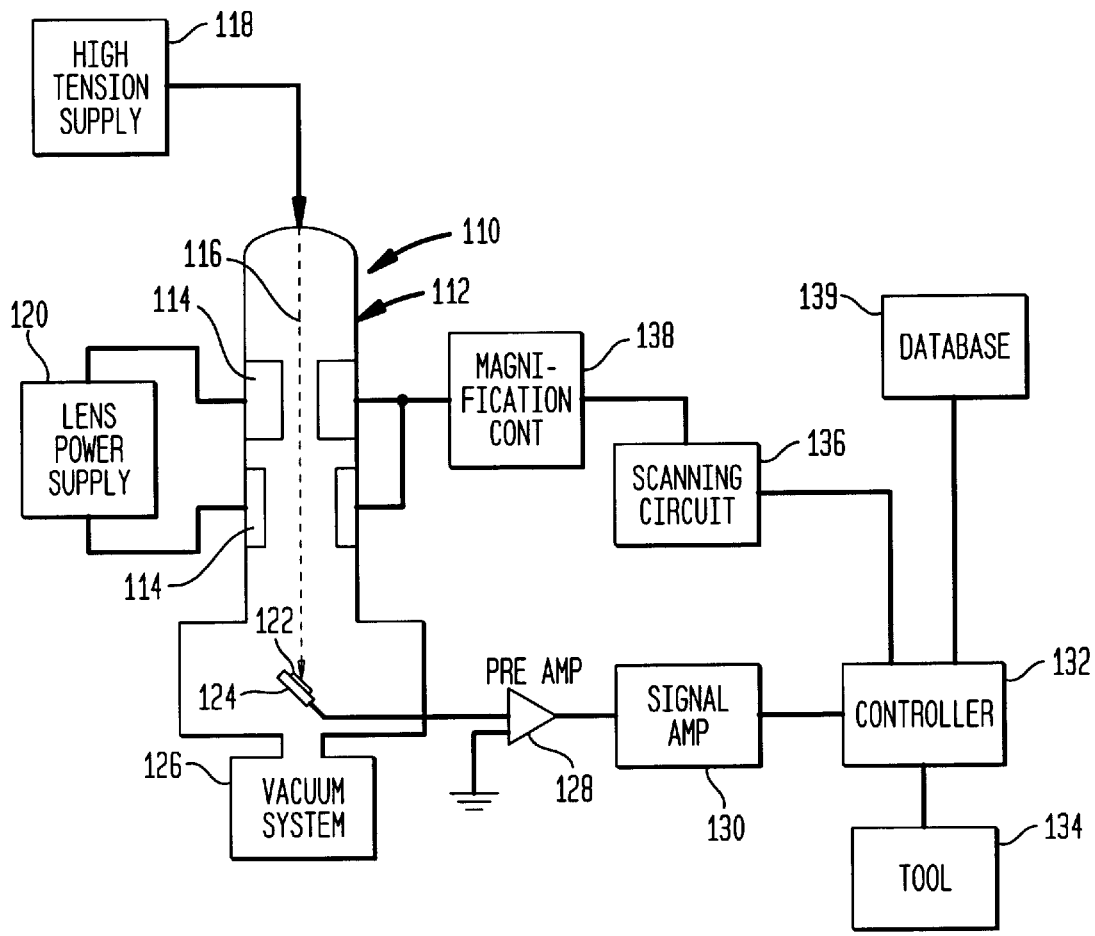
FIG. 2C is a schematic block diagram showing a scanning electron microscope.

FIG. 2C illustrates only one type of scanning electron microscope that can be used to practice the method of the present invention. The scanning electron microscope 110 includes a body 112 with appropriate lenses 114 contained in the body and forming an electron beam channel 116. A high tension supply 118 provides power through the electron beam column formed by the body 112. A lense power supply 120 provides appropriate deflection or control over the electron beam that hits a wafer 122 contained on an electron collector 124. The body 112 forming the column has a maintained vacuum as accomplished through a vacuum system 126. Electrons are collected and sent through a preamplifier 128 and then through a signal amplifier 130 and into a controller 132, which forms the image and can perform processing and calculating of shape and scale in accordance with the present invention. A tool 134 could be adjusted as necessary. The controller 132 also controls scanning circuits 136 and a magnification controller 138. Other electron beam metrology systems using electron beam microscopes are set forth in U.S. Pat. No. 4,600,829 issued Jul. 15, 1986; U.S. Pat. No. 4,751,384 issued Jun. 14, 1988; and U.S. Pat. No. 4,767,926 issued Aug. 30, 1988, the disclosures which are hereby incorporated by reference in their entirety.

Figure 2D:
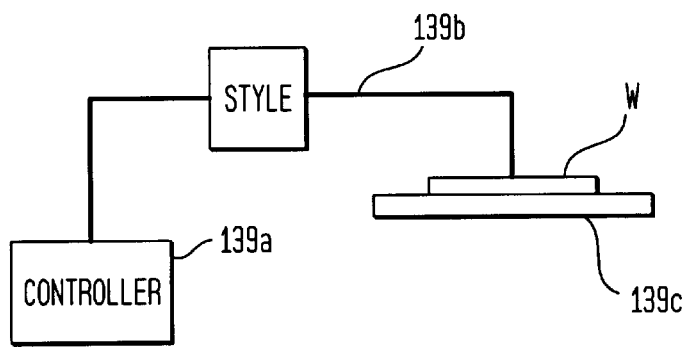
FIG. 2D is a schematic diagram of a stylus line width measurement device.

FIG. 2D illustrates a stylus measuring device using a controller 139a, stylus 139b, and holder 139c for wafer (W).

Figure 3:
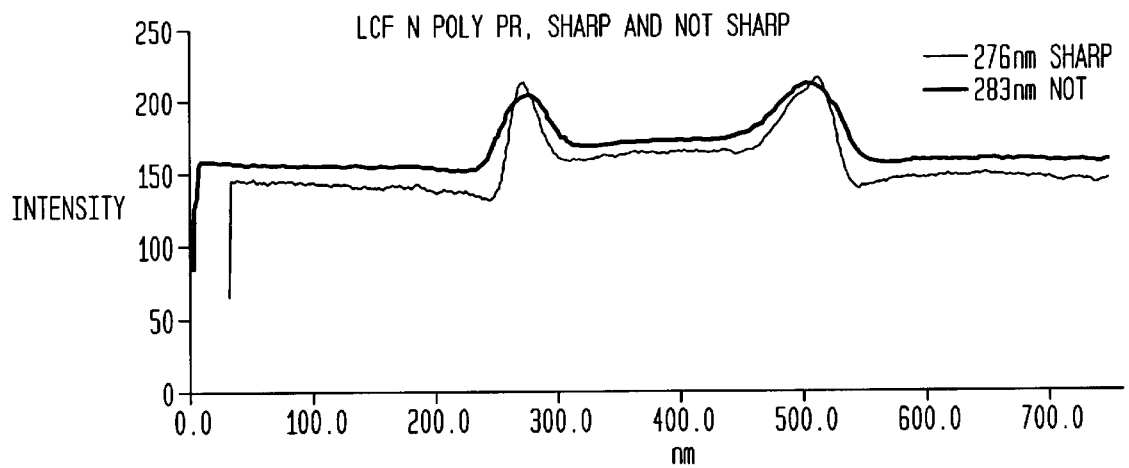
FIG. 3 is a graph showing a waveform obtained from a scanning electron microscope illustrating a sharp (focused) and not sharp (unfocused) waveform.
Figure 4:
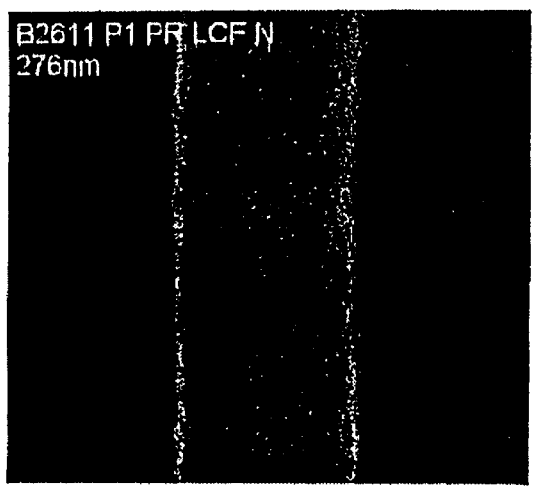
FIG. 4 is an image of the actual scan obtained from the scanning electron microscope for the sharp waveform signal of FIG. 3.
Figure 6:
FIG. 6 is an image of the scan from an unfocused scanning electron microscope of FIG. 3.

FIG. 3 shows a graph of two generated waveforms showing differences between the waveform produced by a sharp and well tuned scanning electron microscope and a scanning electron microscope that is not sharp, i.e., out of focus. The measurements were performed on a photoresist feature formed in a polysilicon semiconductor layer. The well tuned scanning electron microscope produced a 276 nanometer line width, while an untuned (not sharp) scanning electron microscope produced a line width of 283 nanometers. Examples are shown in FIGS. 4 and 6, showing images produced from the scanning electron microscope, where the image from the unfocused scanning electron microscope (FIG. 6) shows a line width having edges that are not well focused, but more spread. In FIG. 4, the edges are more clear.

Figure 5:
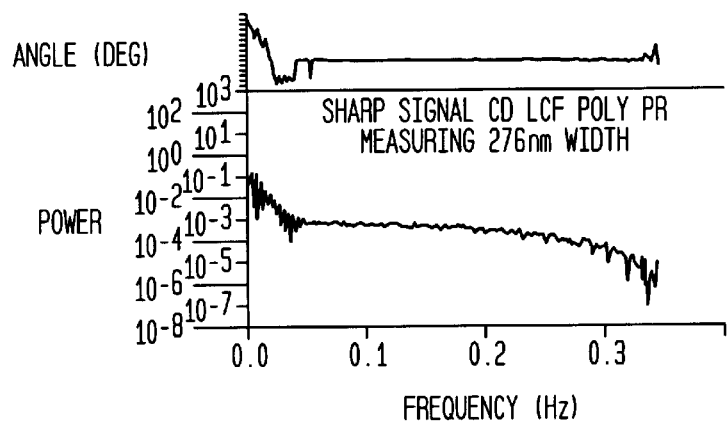
FIG. 5 is a graph showing the frequency signature of the sharp waveform signal of FIGS. 3 and 4.
Figure 7:
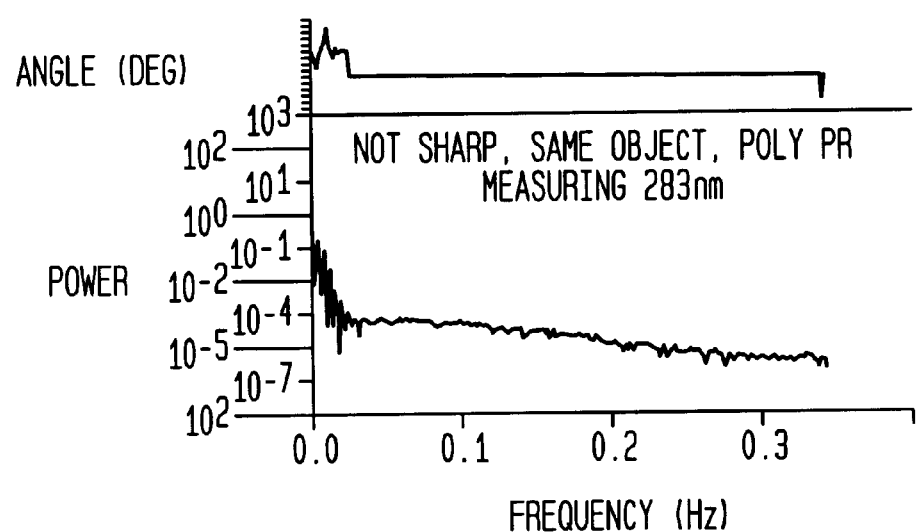
FIG. 7 is a graph showing the frequency signature for the unfocused waveform signal of FIGS. 3 and 4.

The frequency signatures are shown in FIGS. 5 and 7 for a respective focused and unfocused scanning electron microscope. The frequency signatures indicate that the higher frequency components in the unfocused microscope are attenuated. As is well known to those skilled in the art, the Fast Fourier Transform (FFT) function can be performed on the amplitude modulated waveform signal, to produce the frequency signatures, as illustrated. In accordance with the present invention, a frequency signature template indicative of a known patterned feature is formed.

The frequency signature template can be formed by scanning a known patterned feature positioned on a semiconductor layer when the SEM is in nominal, i.e., normal, operating condition. The Fourier Transform produces the frequency signature which would be stored in a database 139 (FIG. 2C). A patterned feature formed on a semiconductor layer of a sample having similar patterned features is then scanned with the line width metrology measurement device, i.e., the SEM in this example, and an amplitude modulated waveform signal indicative of the line width of the patterned feature is generated. This waveform signal is then converted into a frequency signature. The relative power of the frequency components obtained from the similar patterned feature is compared to the frequency components of the frequency signature template. The accuracy of the SEM can then be determined based on the relative proportion between the frequency signatures of the template and similar patterned feature.

As shown in FIGS. 5 and 7, the proportion of the higher frequencies in the frequency signature template is greater than the higher frequencies contained in the similar patterned feature. The relative proportions between the low and high frequencies can also be compared with the relative proportions of the low and high frequencies of the frequency signature template. The relative proportions of high and low frequencies can be determined with the mid-frequencies corresponding to the inner line spacing.

It is well known that line width metrology tools traditionally do not judge the quality of the output amplitude modulated signal with respect to any instrument error. Low frequency components are used for the measurement. The mid to high frequencies are typically not used. As noted before, in accordance with the present invention, the higher frequency components can be used to determine if the scanning electron microscope (or other line width metrology device that generates a preferred amplitude modulated waveform signal) is accurate with respect to the known samples. It is not possible to distinguish accurately an increase in width based only on the low frequency components of the measurement. Thus, the mid and high frequency components of a frequency signature template derived from a known sample are used for a comparison.

The illustrated images and produced waveforms set forth in FIGS. 3–17 were obtained from a Hitachi S-8820 CD SEM (Critical Dimension Scanning Electron Microscope). The image in FIG. 6 was taken of a photoresist line-patterning gate in a routine automated production measurement step. The image of FIG. 4 was taken after an engineer optimized the tool using standard procedures. It is evident that the image in FIG. 6 is hazy or fuzzy and resulted in an inaccurate CD (critical dimension) line width measurement of 283 nanometers. The image of FIG. 4 is sharper. It is shown as the thinner line in FIG. 3 and represents the 276 nanometer line width. The width differential accuracy is a substantial portion of the process line width tolerance and is in addition to any precision metrology errors. The width is defined by the first differential edge position. Two hundred vertical sum lines were used with no signal smoothing.

It is evident that when the sharper (i.e., in focus) signal is compared with the fuzzy or unfocused signal, a substantial proportion of the high frequency components have been replaced with lower frequency components. The very high frequencies are attenuated. The width has also been increased significantly. Thus, it is seen that the accurate increase in CD line width of the unfocused signal can be differentiated from the sharper signal with the same critical dimension width. Thus, the sharp (i.e., focused) and fuzzy (i.e., unfocused) signals have different frequency signatures, independent of normal process width variations. This information can be used with appropriate software as determined by those skilled in the art when the measurement has departed from accuracy requirements needed for a process monitor. It is possible then to attach a quality value to each measurement that results in acceptance or rejection of data. Feedback can occur to a system operator, which results in correction of the problem in the scanning electron microscope. The drift in accuracy costs will also be monitored and proactively addressed.

Figure 8:
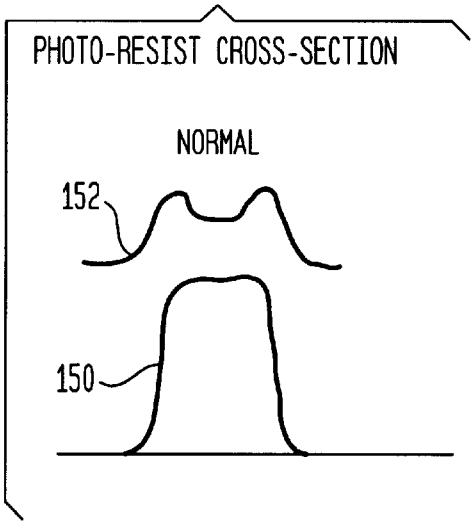
FIG. 8 is a schematic drawing illustrating a photoresist cross-section and waveform signal as generated for normal cross-section, which can be used to form a template.
Figure 9:
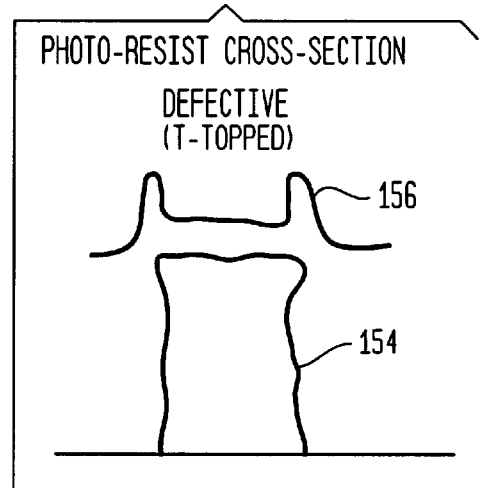
FIG. 9 is a schematic drawing showing a defective (T-topped) cross-section and the generated waveform signal.

As known to those skilled in the art, critical dimension metrology, such as line width and line spacing metrology, attempts to relate the intensity signal of an amplitude modulated waveform signal to the actual size of the feature, known as scale. The intensity signal formed as an amplitude modulated waveform signal is usually visualized and manipulated as a profile or waveform. The measurement of the size (i.e., scale) of a patterned feature, such as the cross-sections shown in FIGS. 8 and 9, involves the extraction of the etch positions from this waveform. These are shown in the top figure portion of FIGS. 8 and 9, illustrating the generated amplitude modulated waveform signal.

The traditional line width metrology, as known to those skilled in the art, ignores much of the effect caused by a variation of the shape of the feature as it is measured on the waveform signal to be analyzed. It is possible, however, to deduce the shape of a feature from the waveform by using a sophisticated interpretation of the shape or profile of the waveform. The analysis of the critical dimension intensity signal formed as the amplitude modulated waveform signal allows a person not only to measure the specific width of a feature, i.e., the scale, as is well known to those skilled in the art, but also allows an operator to determine a better estimate as to the actual shape of the feature. Both photo and etch production process drift can thus be monitored, resulting in improved process and quality control before any gross failures in metrology occur.

Because of the miniaturization of devices with ultra large scale integrated circuits, technology is pushing critical dimension metrology into multiple parameter characterization. Thus, it is no longer adequate to determine only the distance between defined edges of a feature based upon the amplitude modulated waveform signal. The peak areas on the generated waveform signal typically correspond to the edges, which emit energy in greater intensity, as shown in the images of FIGS. 13–15 and 17. Samples with the same nominal critical dimension width, as measured by the line distance, could be different in cross-section shape (profile) and could also function differently in production. When used on a photoresist or a photo mask, these differences would influence the etch or photo transfer function, perhaps creating severe problems downstream in the production and perhaps device failure in device operation.

Throughout the description of the present invention, an intensity scanning electron microscope will be described, which outputs an intensity signal formed as an amplitude modulated waveform signal. However, any waveform signal can be interpreted in a similar manner, even as generated from physical contact instruments, such as stylus instruments, as described above.

FIG. 8 illustrates a normal patterned feature 150, such as formed on a photoresist, and the generated waveform signal 152. FIG. 9 illustrates a photoresist defect caused by T-topping in a photoresist patterned feature 154, which is caused by an amine contamination. Its generated waveform signal 156 is shown in the top portion of the figure. As illustrated, the scale is similar, but the generated waveforms 152, 156 deviate in shape in relation to the cross-sections 150, 154. It is this deviation and profile of the amplitude modulated waveform signals that can be analyzed to determine possible defects in the estimated shape of the patterned feature. The shape of the patterned feature can also be seen in the shape of the amplitude modulated waveform signal, where the shape of the components are extracted.

Figure 14:
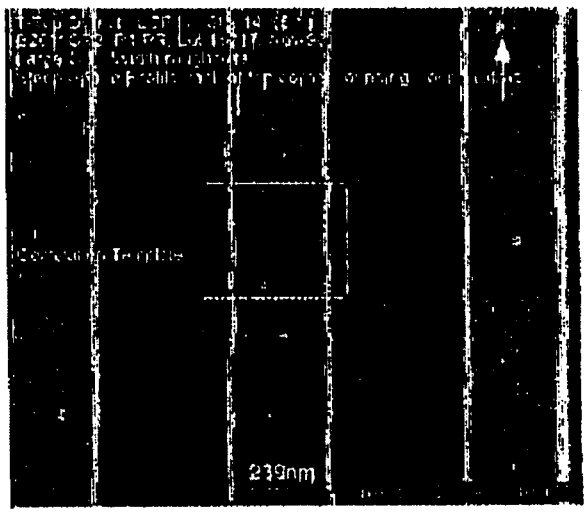
FIGS. 14 and 15 are both top down critical dimension images of a photoresist feature having a normal or "nominal" and the T-top as shown in FIGS. 8 and 9.
Figure 15:
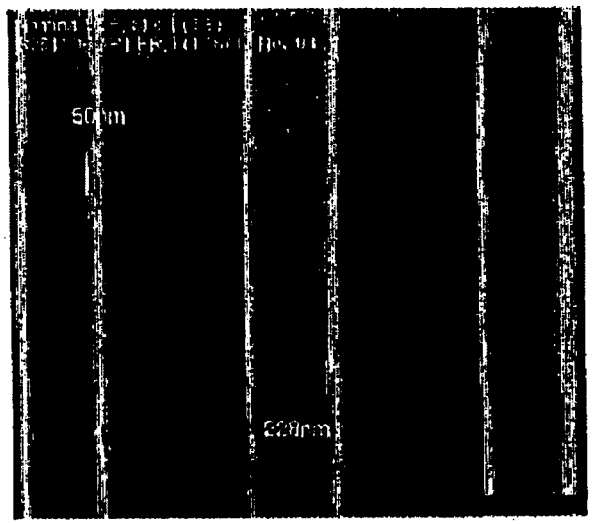

FIGS. 14 and 15 illustrate top down critical dimension line width images of a nested photoresist object both with and without T-top. FIG. 14 illustrates the T-top where the lines are more narrowly defined resulting from the sharp edges of the T-top reflecting light at greater intensity along a more narrow area, as compared to the normal configuration of a photoresist feature shown in FIG. 15.

There are several two-dimensional visual items that distinguish the two images, all of which can be detected from the one-dimensional line traces using signal processing techniques in a controller 132 that is connected to the scanning electron microscope. The controller 132 can use software and signal processing techniques known to those skilled in the art. The width of the white sidewall is considerably reduced in the case of the T-top because of the more sharp edge defined by the T-top. The edge roughness or width variation in the wide direction is also increased in the T-top example.

Figure 10:
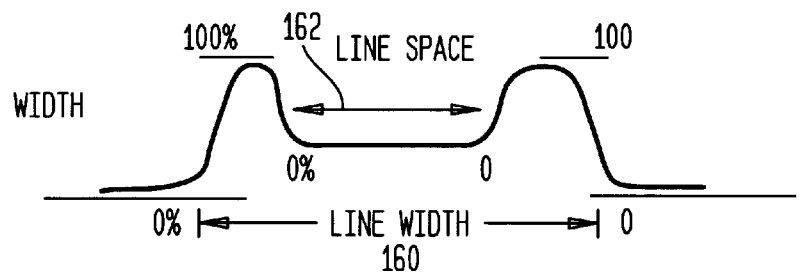
FIG. 10 is a graph of the amplitude modulated waveform signal and showing the line width and line space dimensions.
Figure 11:
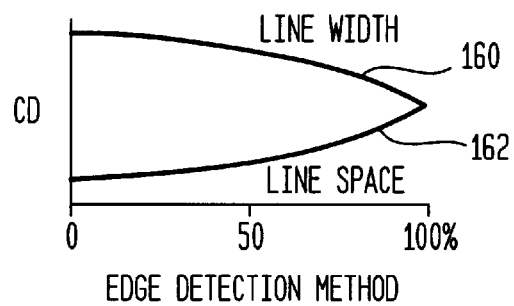
FIG. 11 is a graph showing the curve generated by the slope obtained from the derivative of the line space and line width.
Figure 12:
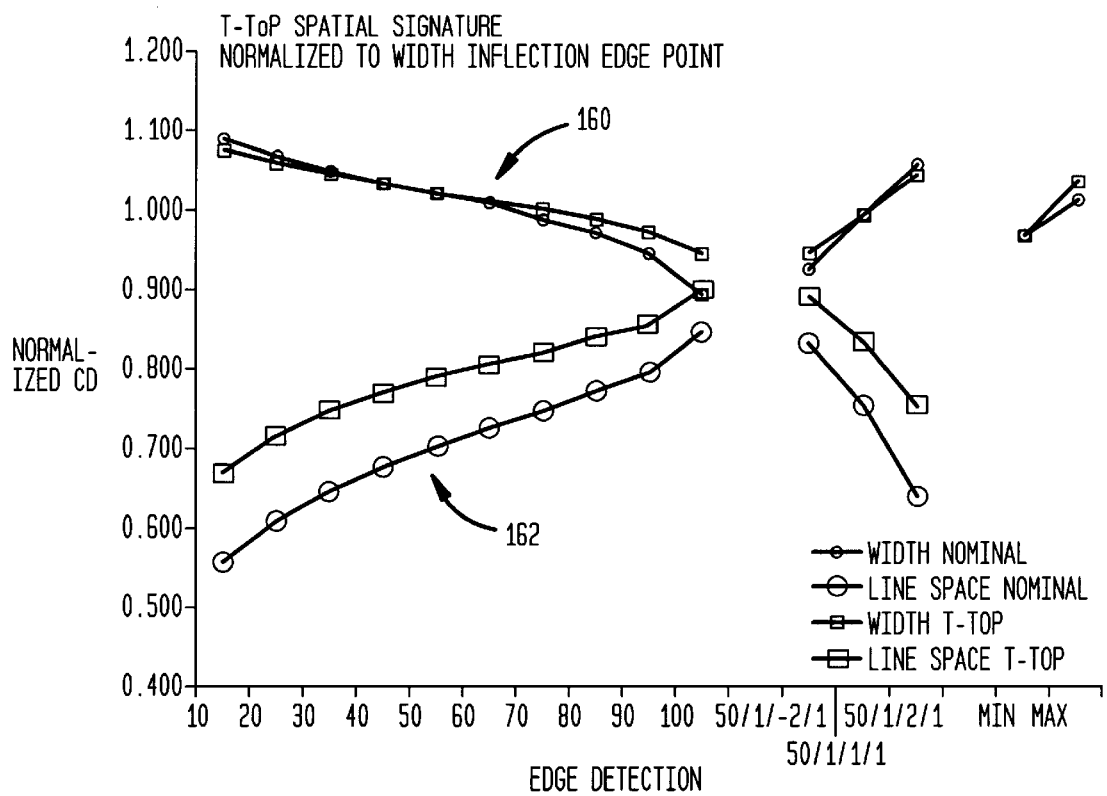
FIG. 12 is a more detailed graph of a Normal vs. T-topped "X" direction Critical Dimension range for images shown in FIGS. 8 and 9.

FIGS. 10 and 11 illustrate edge detection techniques where the line width 160 and line spacing 162 are illustrated (FIG. 10) as part of the amplitude modulated waveform signal. The derivative of the signal is taken along various points to derive a curve, indicating the line width and line space as shown in FIG. 11. The outside line width and inside line space describe the shape of the critical dimension variation of the line width.

By using a template (FIG. 12), it is possible to compare the T-top derived curve, with the derived curve of the template. Thus, the photoresist feature can be rejected based upon a deviation in a predetermined amount from the template curve. The graph of FIG. 12 indicates that greater deviation is along the line spacing. The notations of 50/1/1/1 are Hitachi specific shorthand for first and second differential edge components. The min/max is the range of critical dimension over a length of Y using a specific derivative based etch detection algorithm to describe roughness. The algorithm can be implemented by those techniques known to those skilled in the art.

Deviations of any specific critical dimension or sloped interval could be weighted in an analytical expression. Thus, any individual, small deviation would not trigger a fail, but an accumulation of the deviations could trigger the fail. Some features could be weighted heavier to tune the metrology system to be robust against false-positive fail indications. For example, it would be possible to establish a string of Boolean decisions to determine the pass/fail outcome. For example, any deviation from a specified 10% to 30% width threshold slope could be specified as a fail regardless of the rest of the shape. This slope is known to be strongly related to the patterned transfer process and would be a critical parameter.

Figure 13:
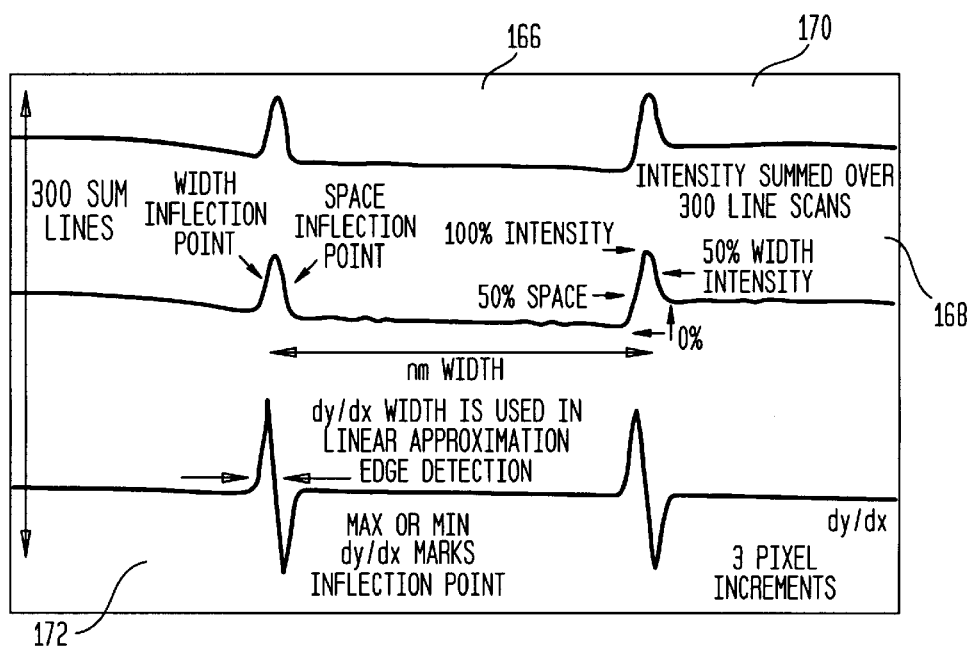
FIG. 13 is an image from a scanning electron microscope showing various width and space inflection points and other waveform points from which the analysis based upon the line width is generated.
Figure 16A:
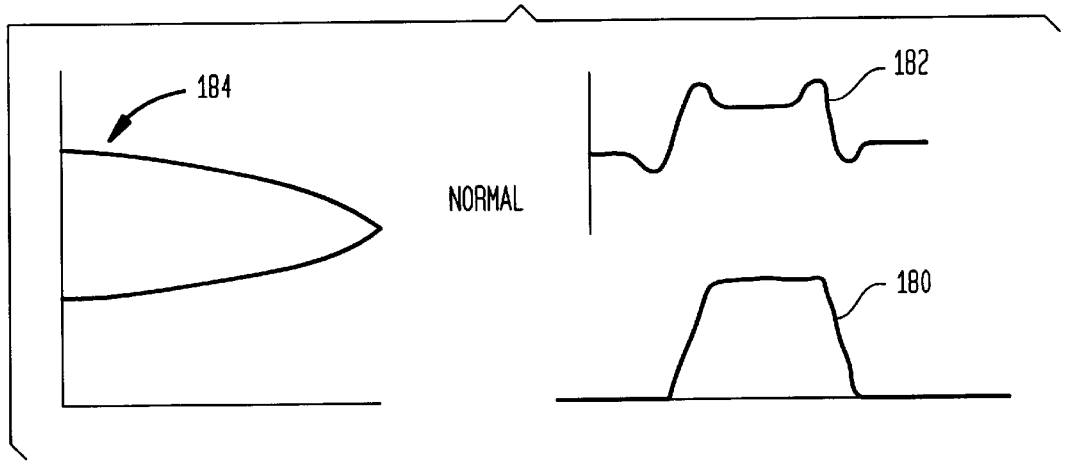
FIGS. 16A through 16C illustrate a normal photoresist feature, a footing, and a topping, respectively.
Figure 16B:
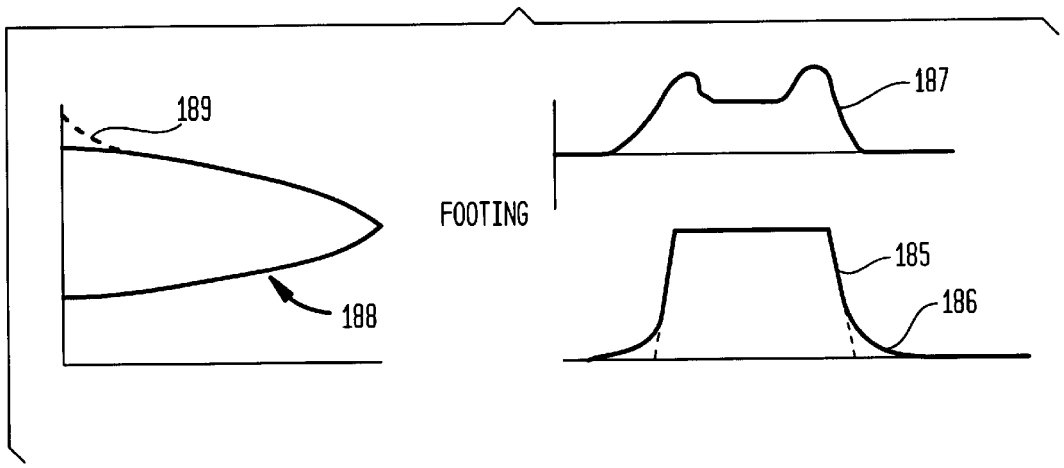
Figure 16C:
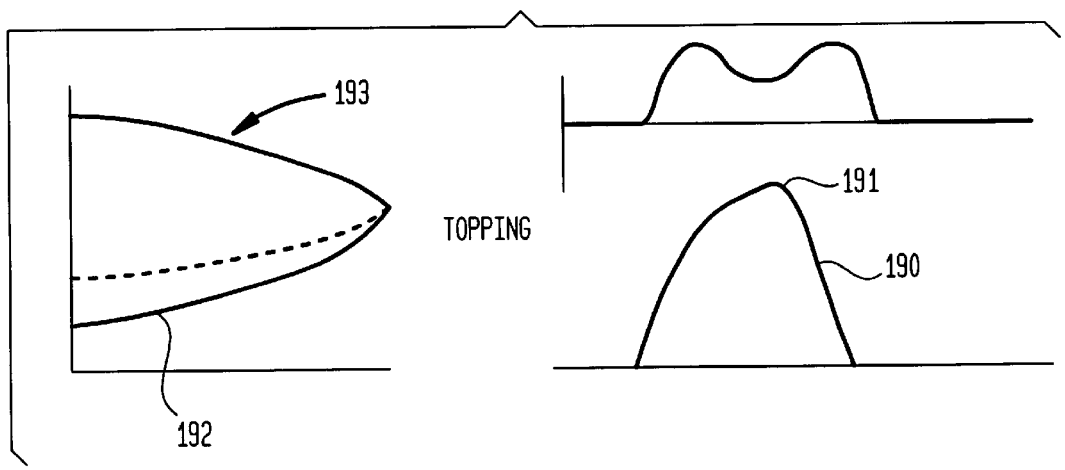

FIG. 13 illustrates another image of the output from the scanning electron microscope showing the overlay of the amplitude modulated waveform signal and the various width and space inflection points. The intensity is summed over 300 line scans. The 50% space and 50% width intensity marks 166, 168 are shown. The 100% intensity mark 170 is illustrated giving the line width in nanometers. The derivative dy/dx width 172 is used in linear approximation for etch detection and the maximum or minimum dy/dx marks are used in the inflection point. FIG. 16A shows a normal patterned feature 180, its generated waveform 182, and derived curve 184. FIG. 16B shows an example of a feature having a footing 186 and its amplitude modulated waveform signal 187 and its derived slope 188 with the footing change shown at 189. The dotted line represents the normal curve from the template. The photoresist feature 190 has a poor topping 191, as shown in FIG. 16C, and the change is shown at 192 in the derived curve 193.

Figure 17:
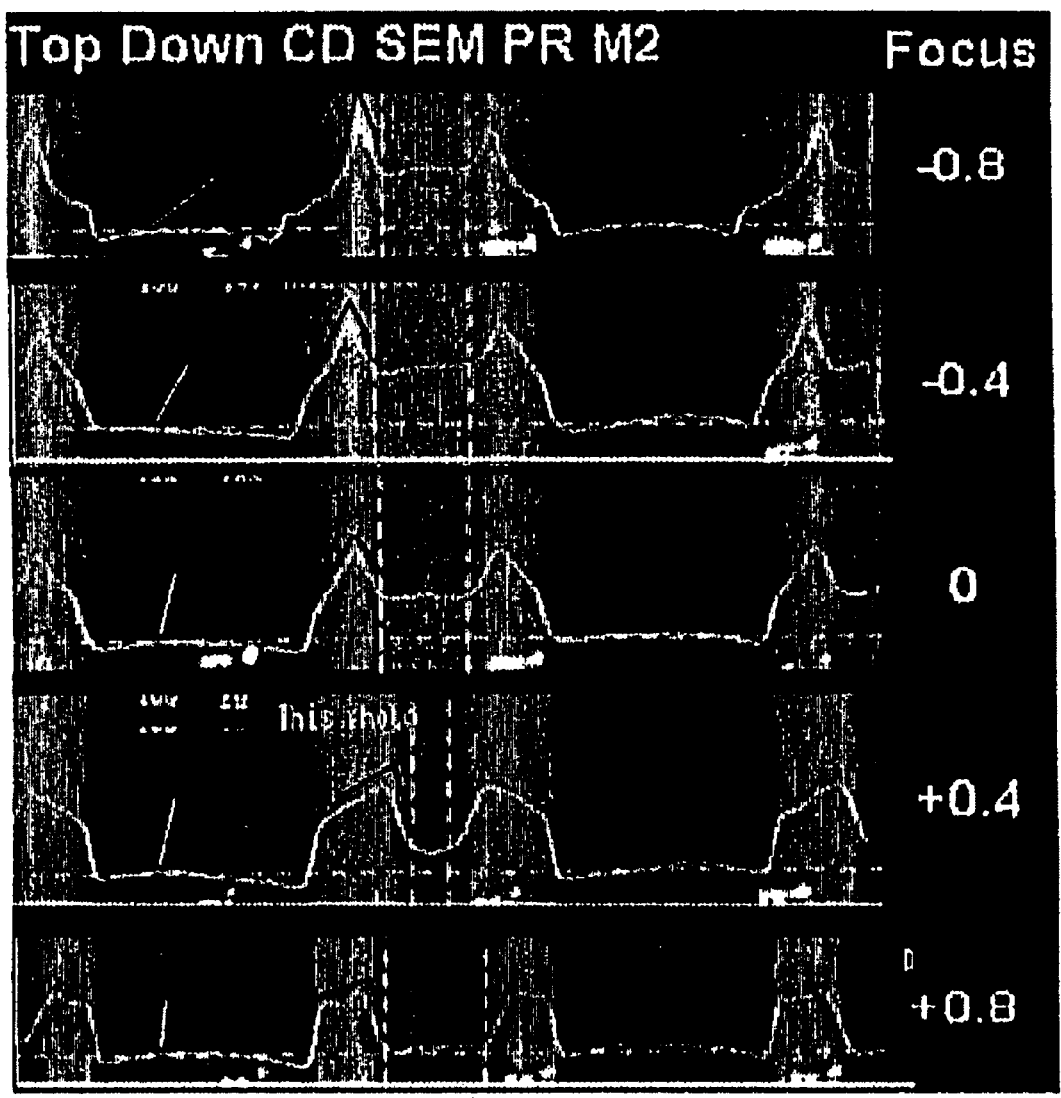
FIG. 17 are images showing a single critical dimension and etched detection parameter, and how it would indicate a similar width for all structures despite large variations in profile shapes and pattern transfer.

FIG. 17 shows an image illustrating how a critical distance etch detection parameter could indicate a similar width for different structures, despite large variations in the profiles, i.e., the shape and pattern transfer.

Figure 18:
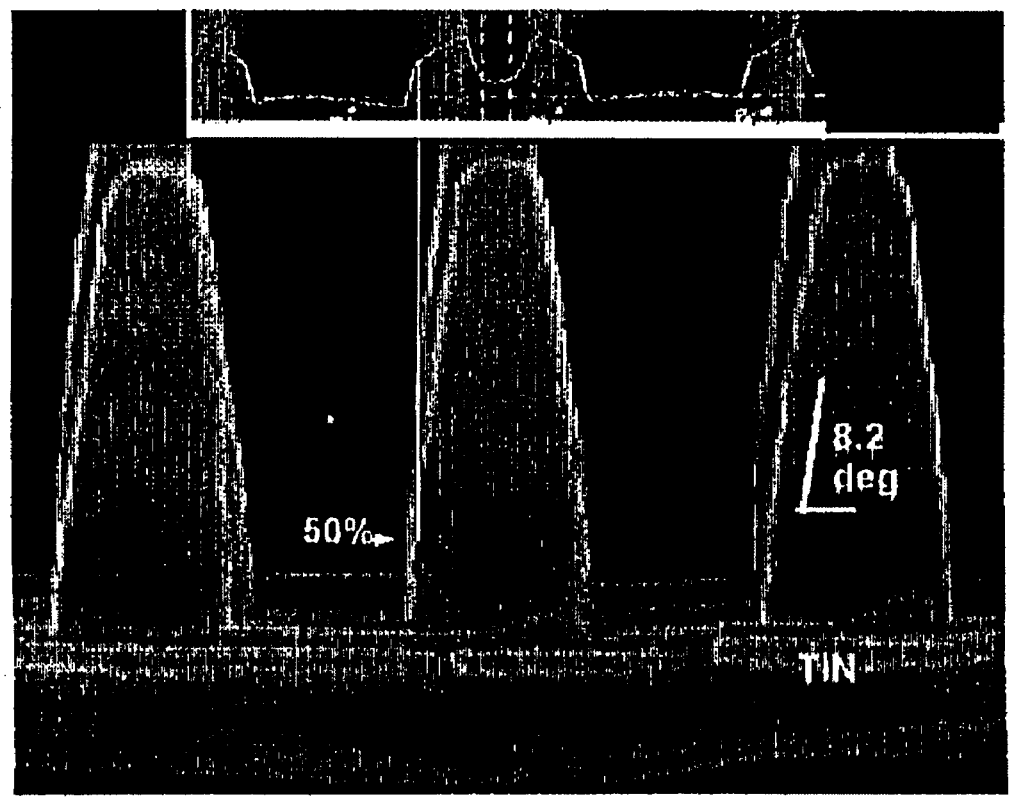
FIGS. 18 and 19 are images showing positive and negative stepper focus, where a thickness reduction is shown in the positive step of focus, and full thickness is maintained in the negative stepper focus.
Figure 19:
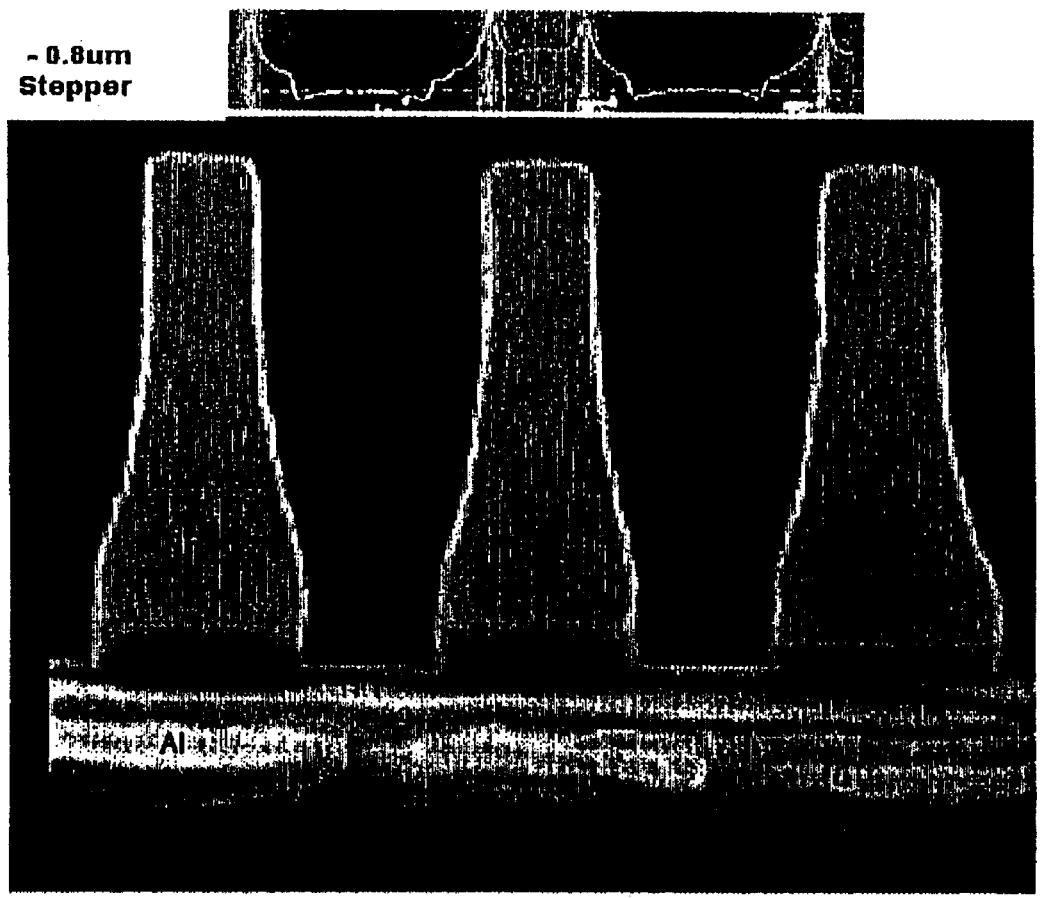

Referring now to FIGS. 18 and 19, images of a positive stepper focus (FIG. 18) and negative stepper focus (FIG. 19) are shown. For example, the stepper focus may have drifted into the positive region in a photoresist system. This would result in a reduced thickness of the photoresist without a large change in the critical dimension width. During etch, the remaining thickness would not be sufficient to properly protect the transferred pattern due to a decreased photoresist thickness.

Figure 20:
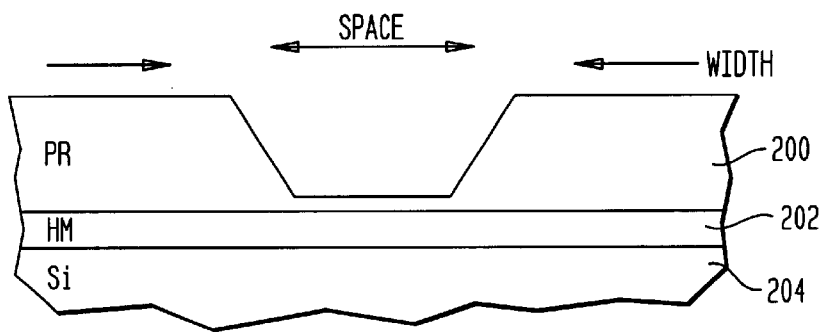
FIG. 20 is a schematic cross-section of a photoresist formed over a hard material, e.g., nitride layer that is formed over a silicon semiconductor layer, and showing the photoresist spacing.
Figure 21:
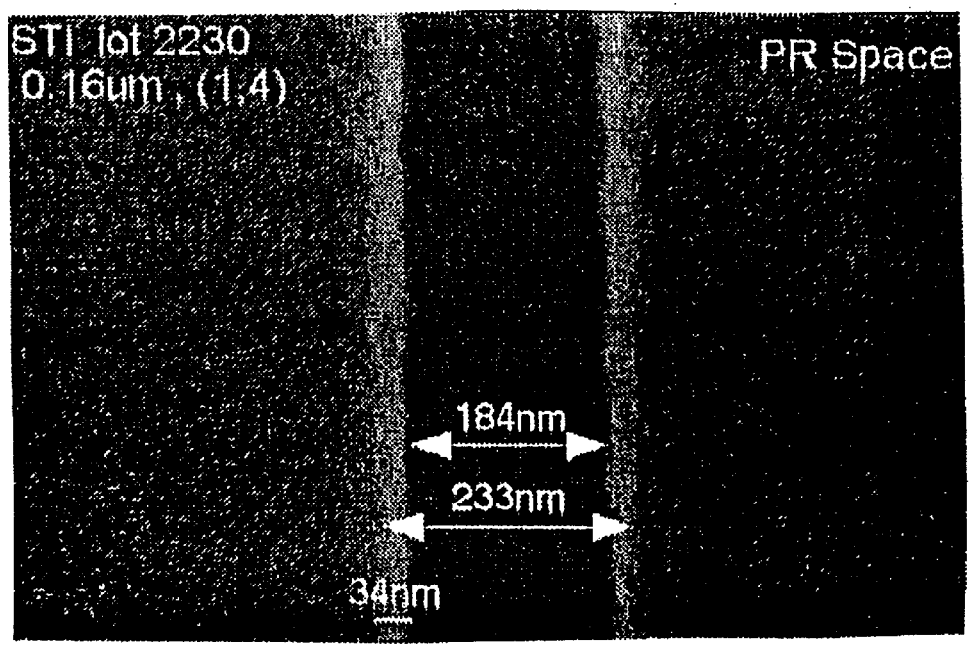
FIG. 21 is a top down critical dimension image of the photoresist feature shown in FIG. 20.
Figure 22:
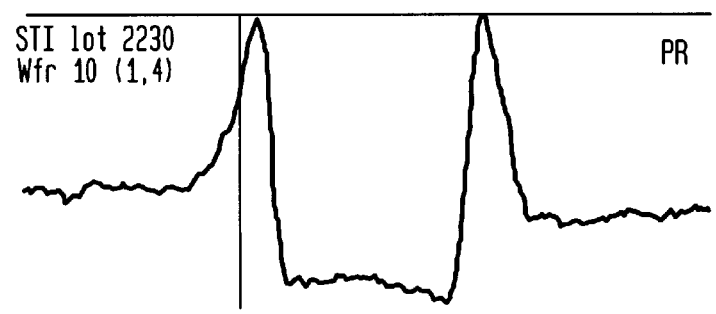
FIG. 22 is a graph showing the amplitude modulated waveform signal produced by a scanning electron microscope as it scans the photoresist feature.

Referring now to FIGS. 20–30, there is illustrated a novel aspect of the present invention that monitors a pattern transfer process in the manufacture of semiconductor device. The method of the present invention permits the cross-correlation of first and second populations of critical dimension measurements to obtain correlation values of the etching process. FIG. 20 illustrates a photoresist layer 200 (PR) that has been formed over a hard material layer 202 (HM), such as a nitride layer that is, in turn, formed over a silicon semiconductor layer 204 (Si) or other similar layer semiconductor material. An image is formed using the scanning electron microscope as shown in FIG. 21 that shows the 184 nanometer spacing corresponding to the bottom of the photoresist trench and the 233 nanometer spacing that corresponds to the edges of the 34 nanometer spacing of the slope. FIG. 22 illustrates the amplitude modulated waveform signal that is formed. This signal illustrates the spacing.

Figure 23:
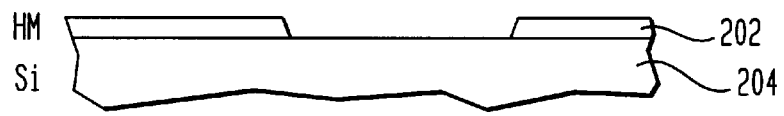
FIG. 23 is a schematic, cross-section view showing the hard material nitride layer that has been removed.
Figure 24:
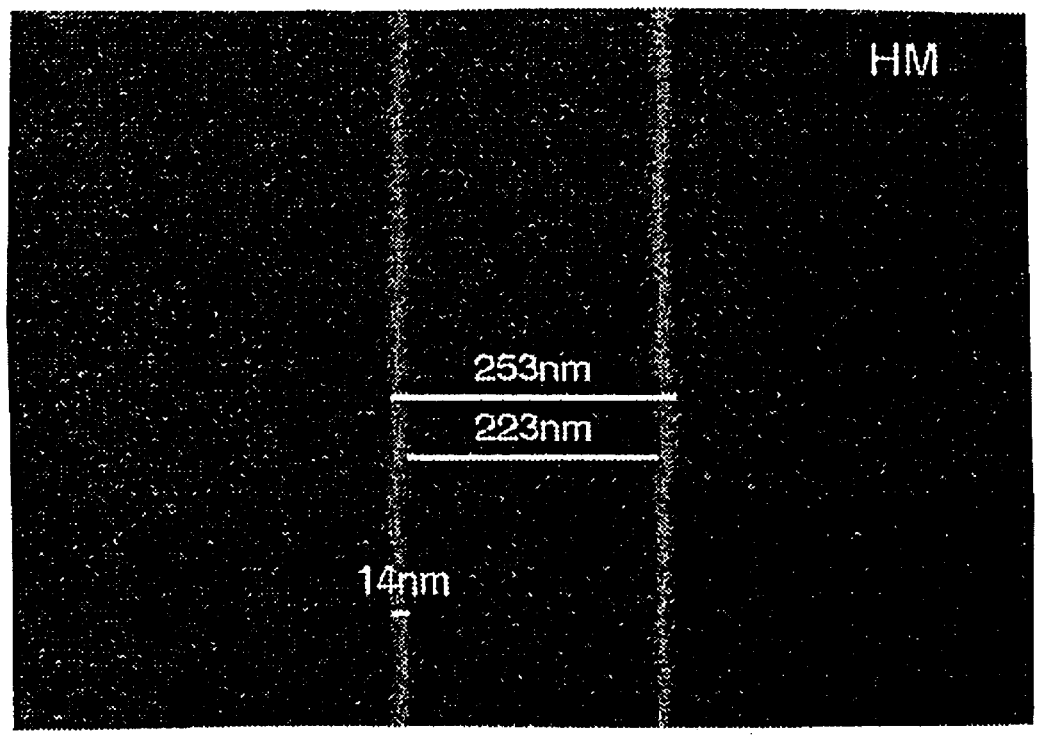
FIG. 24 is a top down critical dimension image of the etched nitride layer.
Figure 25:
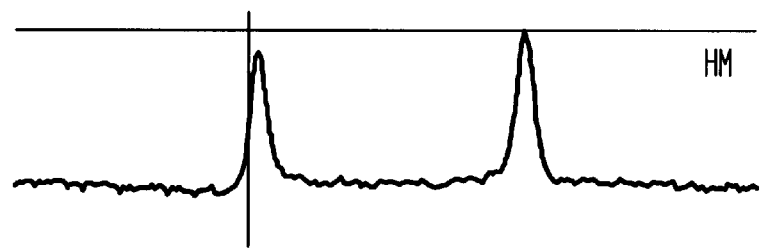
FIG. 25 is a graph showing the amplitude modulated waveform signal produced by the scanning electron microscope as it scans the etched nitride layer.

FIG. 23 illustrates the layer after the nitride layer 202 etching has occurred and the photoresist layer 200 has been removed. A 253 nanometer spacing results from the etching process and the 223 nanometer spacing results for the top portion of the silicon semiconductor layer 204. Naturally, the hard material 202 layer spacing is greater than the photoresist layer spacing because of the resultant etching process.

Figure 26:
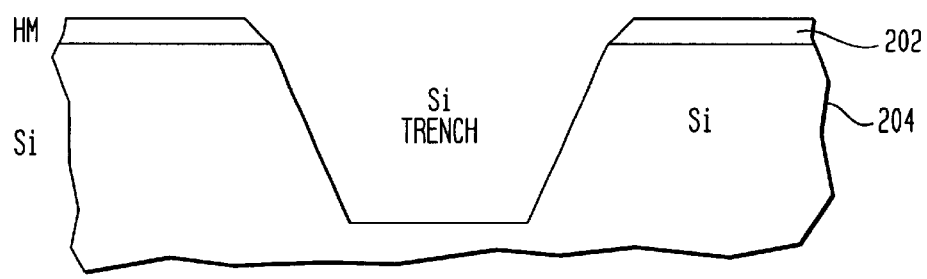
FIG. 26 is a schematic, cross-section view of the etched silicon semiconductor layer.
Figure 27:
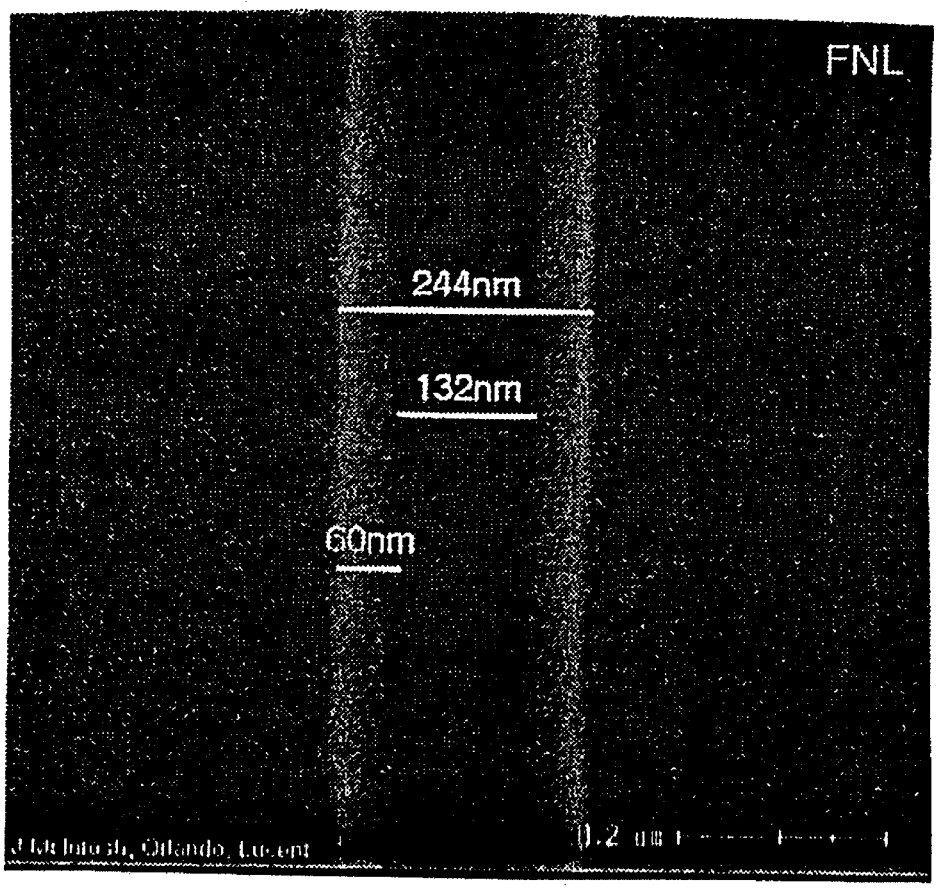
FIG. 27 is a top down critical dimension image of the etched silicon semiconductor layer.
Figure 28:
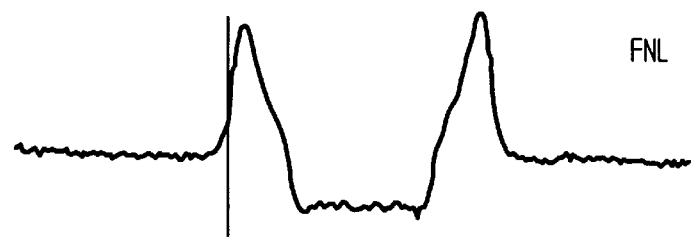
FIG. 28 is a graph of the amplitude modulated waveform signal as it scans the etched silicon semiconductor layer.

FIG. 26 shows the formation of a shallow trench isolation by etching the silicon semiconductor layer 204 and the 132 nanometer spacing at the bottom of the trench, as shown in FIG. 27, and the amplitude modulated waveform signal formed from the final etch as shown in FIG. 28. After obtaining the signals, about 5% to about 10% samples (10 to about 20) can occur to obtain a population of critical dimension measurements. These populations are then cross-correlated. Although a 10 to about 20 sampling is illustrated, the sampling number can vary and is not limited.

Figure 29:
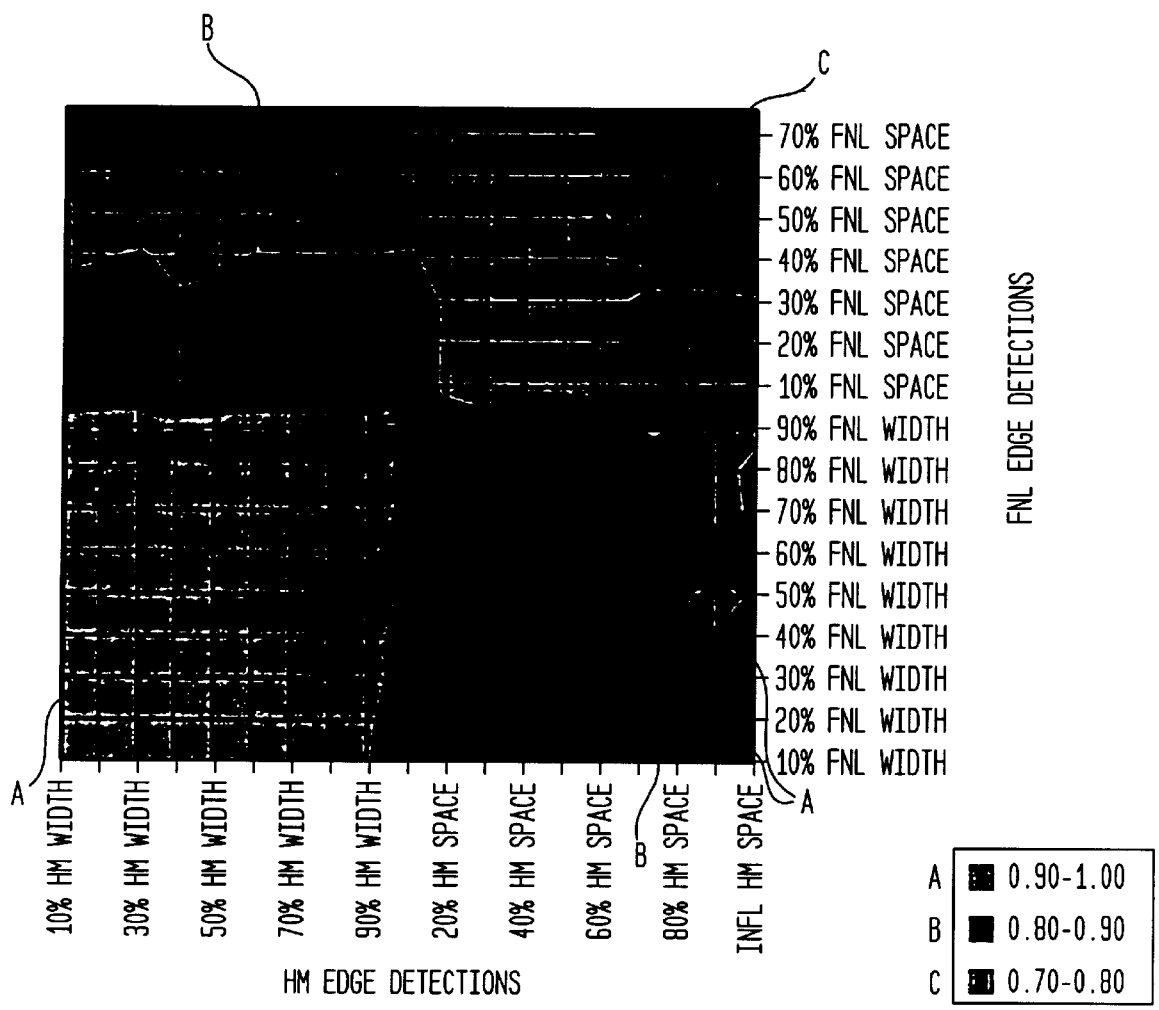
FIG. 29 is a graph showing the correlation values for the final etch detections and the hard material etch detection of FIG. 23.

FIG. 29 shows the graphing of the cross-correlation results that occur between the final edge detection and the hard material edge detection corresponding to the example of FIGS. 20–25.

Figure 30:
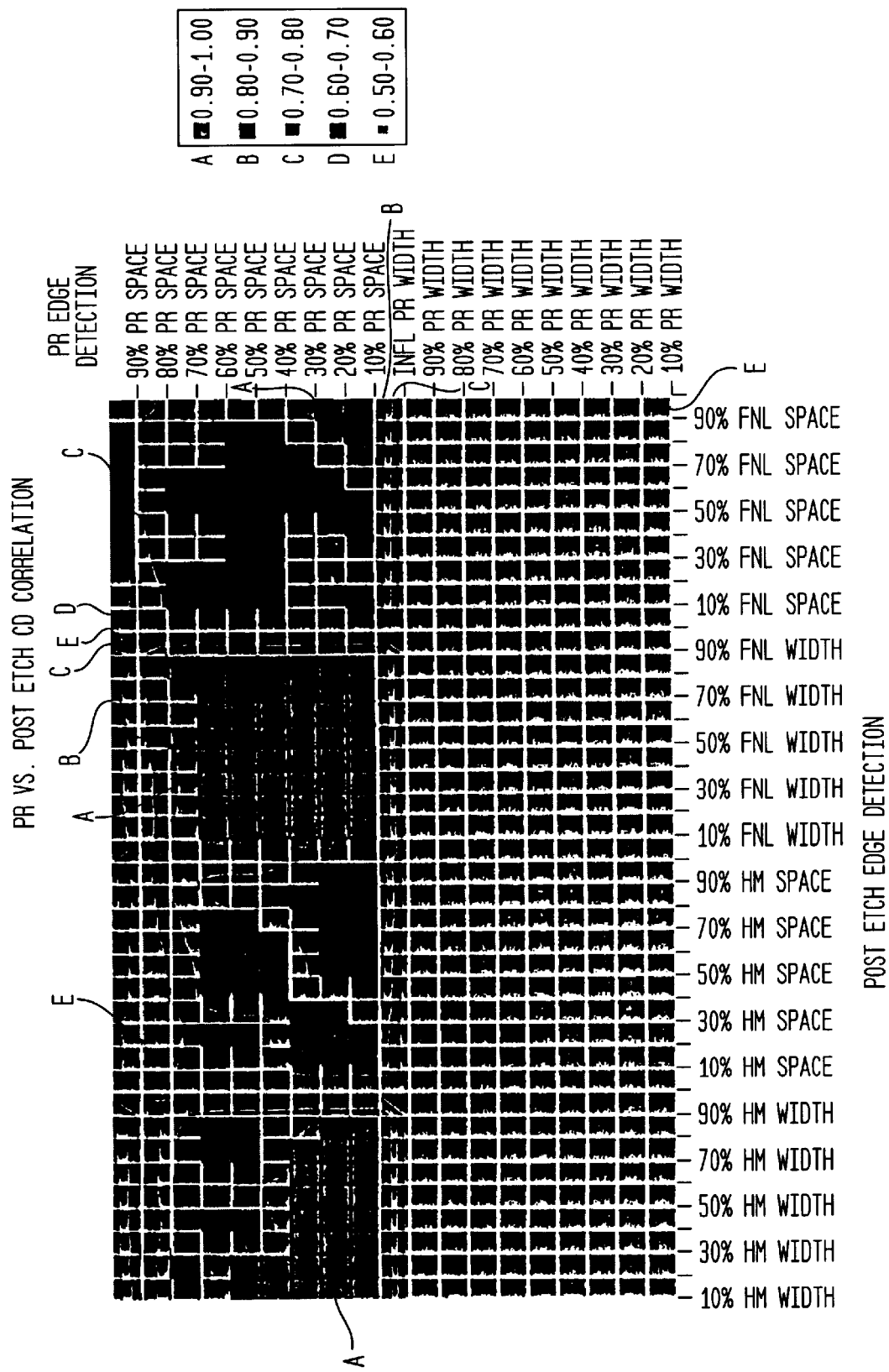
FIG. 30 is another graph showing the post edge etch detection and the photoresist etch detection as shown in FIG. 20.

FIG. 30 shows the photoresist versus post etch critical dimension correlation with the photoresist etch detection and post etch edge detection as shown in the example of FIGS. 20–28.

These correlation results can then be stored in a database and used to determine subsequent etch processing. They are compared with an initial scan over a photoresist as shown in FIGS. 20–22. Thus, it is possible to obtain a better approximation of the etching process. It is evident that the graphs illustrate a 10% spacing between the width and spacing and show that there are ten produced samples. Thus, a large number of samples is not necessary for use with the present invention.

It is possible to detect any significant waveform deviation and fail the entire lot before committing this lot to etching. Because the sensitivity of the process drift is increased, it would be possible to reduce the overdesigned margin of the photoresist thickness resulting in increased quality of the photo step. The increase in the thickness would no longer be necessary as part of the process. Thus, as a result, a better overall pattern transfer would occur with less scrap due to unmonitored process variations.

A prior art metrology system using a single parameter line width control would not note the deviation and shape associated with the focus drift and loss of height. As noted before, the prior art single parameter line width metrology targets only an approximation of scale. It is well known that the smaller features contain significant proportion of width (or scaled) contribution in the shape of the object. The features of the same scale could pattern transfer the mask or photoresist level differently with different shapes.

In the manufacturing process, the calculated shape and scale and positional distribution can be used for adjusting a subsequent etch process to compensate for any defects in the patterned feature. For example, when the T-top of FIGS. 9 and 14 is determined to exist, it is possible to change the subsequent etch process to compensate for this defect in the patterned feature. Not only does the invention distinguish scale and shape, but the present invention also allows a positional distribution of scale and shape to be determined based upon the scanning step. For example, the edges of the wafer could be larger than the center portion of the wafer, or the center portion may have a different shape than the edges or any combination. Thus, not only is the scale and shape important, but the positional distribution of the various defects are important for adjusting the etching process. For example, 100 sites on a wafer could be scanned forming a matrix. These 100 points are measured with the scale and shape and each of the 100 points would have a specific scale and specific shape. Thus, the etch personnel would have to know not only the scale and shape, but the positional distribution and that information would be used to adjust the etching process to account for the scale, shape and positional distribution.

The scanning electron microscope forms multiple measurements and is used for the computer calculation of the shape and size of the resist or other features as noted before. This information can be fed forward in a subsequent etch step, where the information is processed to decide on the most appropriate manufacturing process to improve shape, by adjusting different parameters such as the pressure, gas mixture and flow rates, power and magnetic field, for example, in a plasma etch process. Thus, certain abnormalities and defects present after lithography can be corrected in the etch process, imparting a more desirable scale and profile, i.e., shape, to the final patterned feature. This is in contrast to a conventional prior art method, where the photoresist would be removed and the lithography process would be repeated because in line width metrology systems, shape was not determined.

As shown in FIGS. 31A and 32A, it is possible to represent a photoresist distribution of patterned features of scale in a population distribution, and in a shape population distribution, as also shown in FIG. 32A. A matrix of scale and shape values based on a population distribution for a plurality of patterned features can be established as illustrated in FIG. 33. Thus, based upon the scale and shape values, it is possible to obtain an etch process recipe corresponding to a matrix value (e.g., C3) which demands a change in the etching process. The matrix shown in FIG. 33 becomes a recipe choice matrix for etching.

Typically, a patterned partition is divided by distribution into bins or different lots, with some lots small and some lots large. Thus, there exists a scale versus shape distribution, as shown in FIGS. 31A and 32A. If one knows that an incoming lot has a population distribution of patterned features corresponding to C3, then subsequent process changes will occur based on that variable. For example, C3 could be characterized by T-topping, or characterized by a larger scale and a more pronounced slope in the shape. Thus, the controller in the system of the present invention would direct that the C3 type of material is incoming to the etched que, and the particular shape and size based upon the C3 database would have to be changed. The combination of different etches would be available to compensate for the C3 type of photoresist pattern.

The type of changes in the etch process can vary. For example, the plasma density can be altered in the etch process to alter locally the etch rate and total etch. This can accommodate photo deviations from specifications by using feed forward metrology. There could be backside cooling zones of variable etch rate. Traditionally, the plasma stream is uniform across the wafer. It would be possible to use many independent electrodes for specific patterning or direct plasma with variable magnetic fields to alter the local density. The local gas pressure could be varied and wafer position for etching could be adjusted in some instances.

In some cases, it may be possible to create plasma in a separate reaction chamber, and direct it variably toward a point on the wafer, using a focusing or directional optional system with specific energy.

Figure 51:
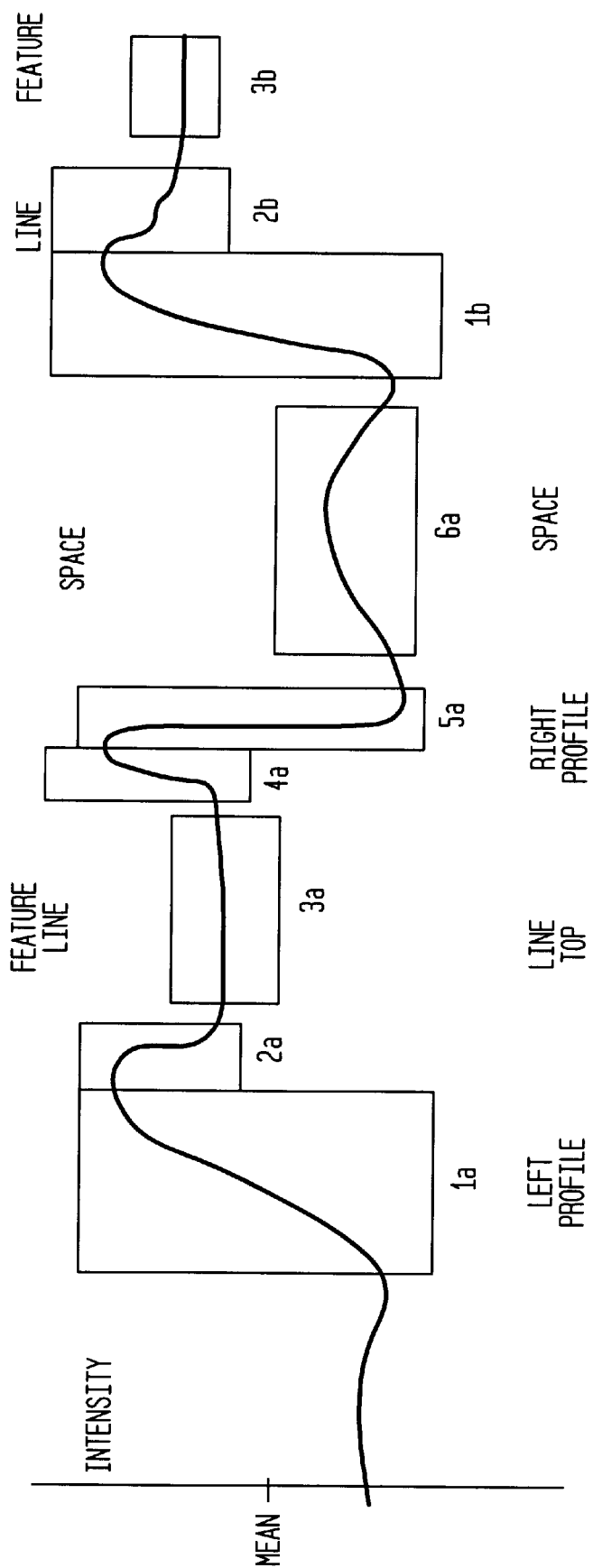
FIG. 51 is a detailed waveform signal showing how the signal is split by parts, indicative of characteristic surface portions of the patterned feature.

The present invention is also advantageous because a layer on the surface having patterned features can be analyzed via segments of the amplitude modulated waveform signal, as shown in FIG. 51. The analysis "by parts" allows a weighting of certain segments for emphasis. Thus, the physical relationships among the signal parts and the physical object can be separated, and any confusing aspects of scale can be eliminated. Thus, it is possible to separate shape from scale in the metrology system of the present invention.

For purposes of background, FIGS. 34–50 describe a whole signal correlation process (not by parts), which allows the measure of an entire amplitude modulated waveform signal with a reference signal formed of an amplitude modulated waveform signal.

Further details of this system are set forth in U.S. patent application Ser. No. 08/957,122 filed Oct. 24, 1997, and entitled "SCANNING ELECTRON MICROSCOPE SYSTEM AND METHOD OF MANUFACTURING AN INTEGRATED CIRCUIT," assigned to the present assignee, the disclosure which is hereby incorporated by reference in its entirety.

After describing the "whole" correlation, the description will proceed with the aspect of the present invention directed to the scanning electron microscope system shown in FIG. 2C, which measures and analyzes the surface topology of a wafer during the manufacturing process, and then correlates the signal deviations "by parts."

The surface topology is first measured using a scanning electron microscope 10. The measured topology is then processed using signal processing techniques within controller 132 and compared to data from a standardized wafer which has been processed in the same manner and stored in database 139. Differences and errors in the wafer are manifested in the measured topology and may be detected by the comparison. As a result, processing monitoring may be improved and fatal errors in the wafers may be detected before further processing. Further, the above process may be implemented without adding additional steps to the manufacturing process, because the scanning electron microscope is already used during processing.

The scanning electron microscope (SEM) scans a wafer (e.g., the substrate) having a surface feature, and produces a wafer waveform signal $y_i(t)$. The SEM is, for example, Model S8820 available from Hitachi of Japan. The SEM is coupled to the processor of controller 132, as is well known to those skilled in the art.

The processor receives the wafer waveform signal $y_i(t)$ and detects errors and deficiencies in the wafer by analyzing the wafer waveform signal $y_i(t)$. In addition, the processor may detect deviations in the manufacturing process such as variations between tools. This process may be performed in-line during the manufacturing process. "In-line during the manufacturing process" means during the process of forming circuitry on the wafer. Consequently, process errors and degraded quality in, for example, the lithography and etching processes may be detected before manufacture of the devices is completed.

In this way, adjustments may be made in the manufacturing line to correct, for example, tool drift and tool-to-tool matching for SEMs, steppers and etchers. This allows problems such as SEM charging, stepper out of focus, and over etch errors to be detected and corrected. Further, defective wafers may be detected and removed prior to further processing. In addition, wafer characterization may be performed to profile degradation across a wafer. As a result, the cost of the manufacturing process may be decreased while increasing the quality of the wafers produced.

As noted before, the SEM system also includes a database 139 for storing reference data. The SEM system may also include a tool or tools 134 that may be automatically or manually adjusted in response to the analysis performed by the SEM system. The components may be combined into one or more components, and may be implemented in hardware or software as known to those skilled in the art.

Figure 34:
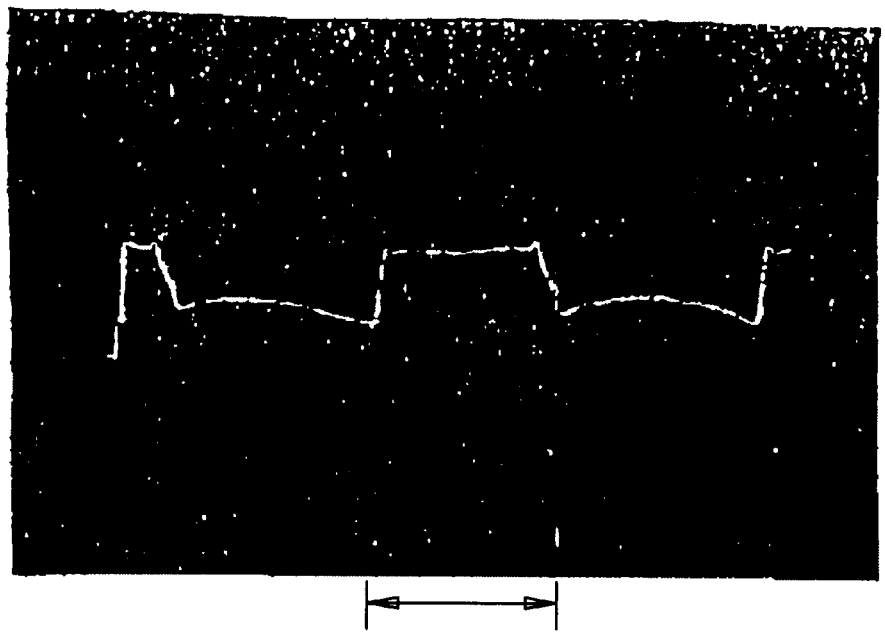
FIGS. 34–50 are graphs illustrating the operation of a scanning electron microscope system where signal segments of a scanned waveform signal use an auto-correlation function to produce an auto-correlation signal, which is then compared with a reference signal.
Figure 35:
Figure 36:
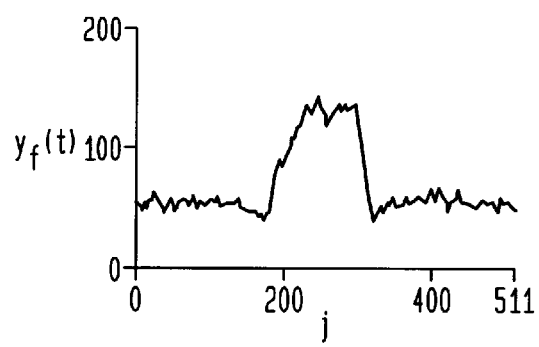

The SEM acquires the wafer waveform signal $y_i(t)$ by scanning. An example of a waveform for a charged resist line is shown in FIG. 35, while FIG. 34, shows one possible standard waveform, such as a reference or "template." The processor generates a processed waveform signal $p_{22}$ from the wafer waveform signal $y_i(t)$, by implementing a cross-correlation operation. In this way, phase errors (picture offsets) which may occur in the SEM can be eliminated. As a result, the wafer waveform signal $y_i(t)$ may be compared to a standard waveform signal $p_{11}$.

The processor processes the wafer waveform signal $y_i(t)$ using, for example, equation (1) below to produce a converted waveform signal $Y_i(jw)$ $$F[Y_i(t)]=Y_i(jw) \tag{1}$$

Figure 37:
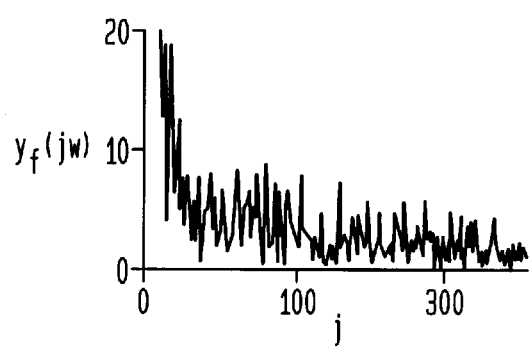

Equation (1) implements a Fast Fourier Transform (FFT). FIG. 37 is an exemplary converted waveform $Y_i(jw)$ shown in FIG. 36. The converted waveform signal $Y_i(jw)$ is filtered using a low pass filter as is shown in equation (2) below to produce a filtered waveform signal $Y_f(jw)$.

$$F[Y_t(jw)] = Y_f(jw) \tag{2}$$

Figure 38:
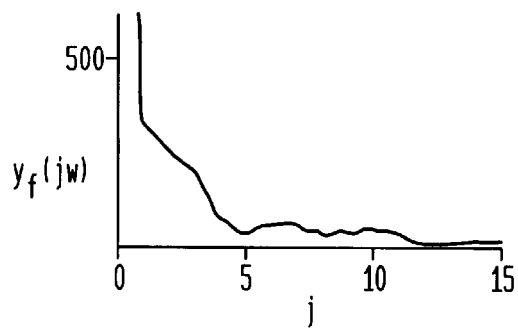

For example, the filter implemented by equation (2) may pass a quarter (¼) or less of the components of the converted waveform signal $Y_t(jw)$. The high frequency components are removed to reduce the noise in the wafer waveform signal $Y_t(t)$. FIG. 38 is the filtered waveform signal $Y_f(jw)$ corresponding to the converted waveform signal $Y_t(jw)$ shown in FIG. 37.

An auto-correlation operation is performed to produce a wafer auto-correlation signal $R_{22}(jw)$ from the filtered waveform signal $Y_f(jw)$ using equation (3) below.

$$R_{22}(jw) = Y_f(jw) Y^*_f(jW) \tag{3}$$

Figure 39:
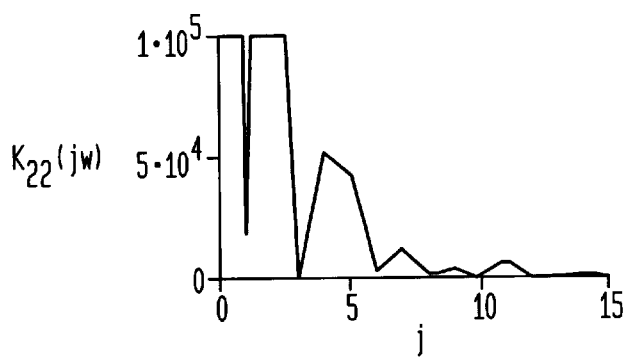

In equation (3), the "*" indicates a complex conjugate. An exemplary wafer auto-correlation signal $R_{22}(jw)$ is shown in FIG. 39. An inverse transform is performed to produce a transformed signal $r_{22}(t)$ using equation (4) below:

$$r_{22}(t) = F^{-1}\left[\frac{R_{22}(jw)}{N}\right] \tag{4}$$

Figure 40:
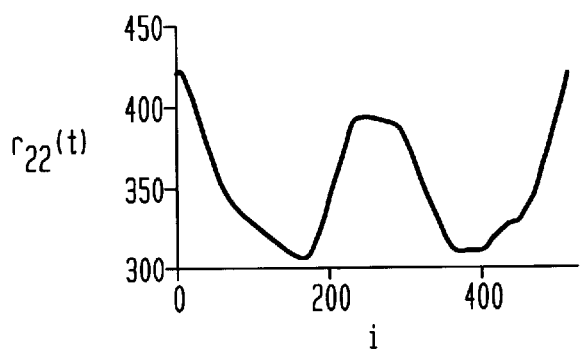

In equation (4), N is the total number of pixels that would be used for displaying the waveform or the total number of input quantities (samples). For example, an exemplary transformed signal $r_{22}(t)$ is shown in FIG. 40.

The maximum value $MAX_{22}$ of the transformed signal $r_{22}(t)$ is determined at a phase or lag equal to, for example, zero (0) as is shown in equation (5) below.

$$MAX_{22} = r_{22}(t) \; (t=0) \tag{5}$$

The transformed signal $r_{22}(t)$ is normalized according to equation (6) below to produce the processed waveform signal $p_{22}$.

$$p_{22}(t) = \frac{r_{22}(t)}{MAX_{22}} \tag{6}$$

Figure 41:
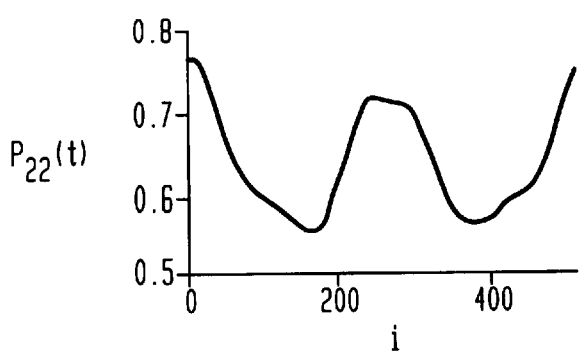

An exemplary transformed signal $r_{22}(t)$ is shown in FIG. 41 where the transformed signal $r_{22}(t)$ is normalized for probability densities for a lag of i. The maximum value $MAX_{22}$ could be, for example, 332.164.

The processed waveform signal $p_{22}$ is compared to a standard waveform signal $p_{11}$. The standard waveform signal $p_{11}$ is used as a bench mark to determine whether other wafers have deficiencies and satisfy quality standards and to detect variations in the manufacturing process. The standard waveform signal $p_{11}$ is derived from a scan of a standard wafer (not shown). The standard wafer is a wafer that satisfies the desired manufacturing criteria for producing the wafer. In other words, the wafer is acceptable if the wafer is within a specified range of the standard wafer. The process for deriving the standard waveform signal $p_{11}$ is the same as the process for producing the processed waveform signal $p_{22}$ except the process is performed on a scanned signal from the standard wafer.

Figure 42:
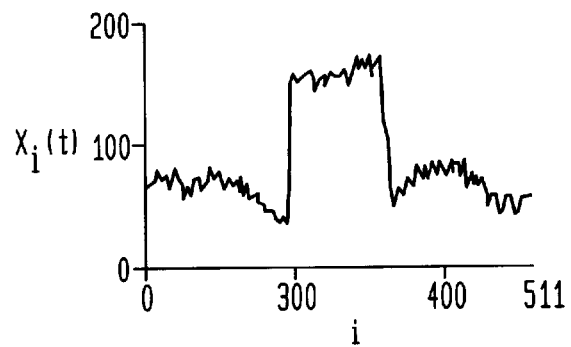
Figure 43:
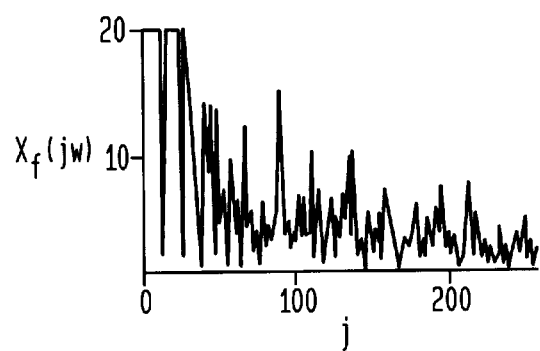
Figure 44:
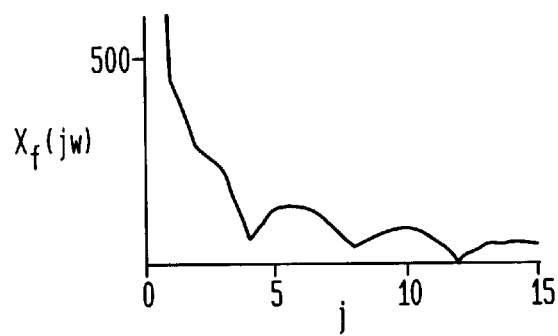
Figure 45:
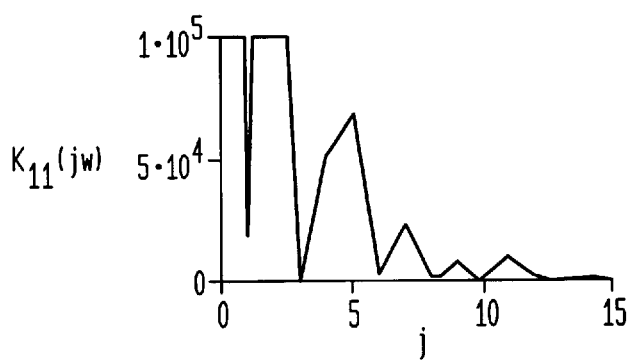
Figure 46:
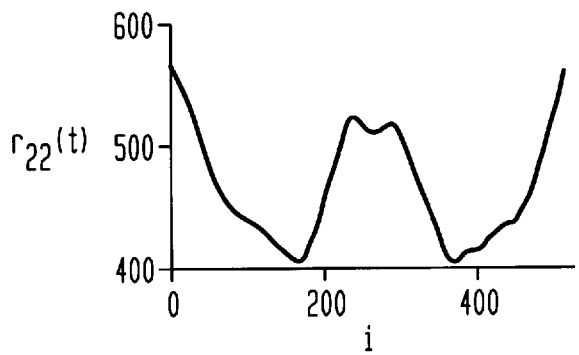
Figure 47:
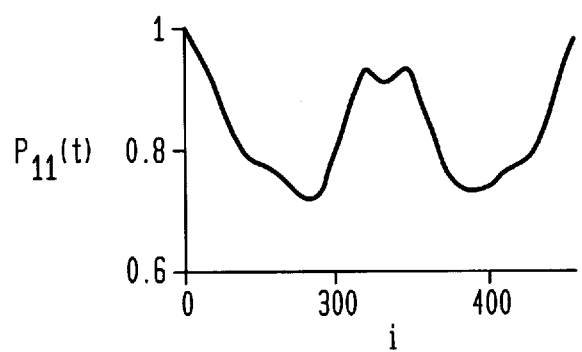

FIGS. 42–47 are exemplary waveforms corresponding to the process steps used in deriving the standard waveform signal $p_{11}$. FIG. 42 is an exemplary wafer waveform signal $x_t(t)$ for a resist line on the standard wafer. The resist line is not charged. FIG. 43 is an exemplary converted waveform $X_t(jw)$ for the wafer waveform signal $x_t(t)$ shown in FIG. 42. FIG. 44 is the filtered waveform signal $X_f(jw)$ corresponding to the converted waveform signal $X_t(jw)$ shown in FIG. 44. FIG. 34 is the wafer auto-correlation signal $R_{11}(jw)$ for the filtered waveform signal $X_f(jw)$ shown in FIG. 44. The transformed signal $r_{11}(t)$ of the auto-correlation signal $R_{11}(jw)$ is shown in FIG. 46. Finally, FIG. 47 shows the standard waveform signal $R_{11}(t)$ corresponding to the transformed signal $r_{11}(t)$ shown in FIG. 46. The maximum value $MAX_{11}$ used to produce the standard waveform signal $R_{11}(t)$ shown in FIG. 40 could be 551.405.

The processor then determines whether the comparison waveform signal $p_{12}$ is within a predetermined range. A cross-correlation signal $R_{12}(jw)$ is generated from the processed waveform signal $p_{22}$ and the standard waveform signal $p_{11}$ by converting them to the frequency domain and using equation (7) below.

$$R_{12} = X_f(jw) Y^*_f(jw) \tag{7}$$

Figure 48:
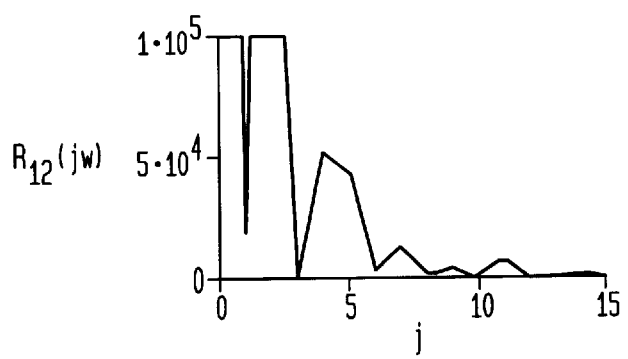
Figure 49:
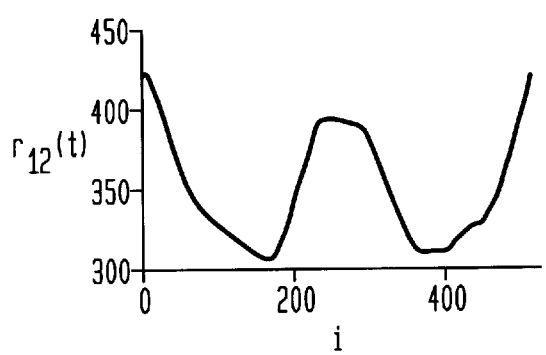

"*" indicates the complex conjugate. FIG. 48 is an exemplary cross-correlation signal $R_{12}(jw)$ of the processed waveform signal $p_{22}$ and the standard waveform signal $p_{11}$.

The cross-correlation signal $R_{12}(jw)$ is converted to the time domain using equation (8) below to produce the inverse cross-correlation signal $r_{12}(t)$.

$$r_{12}(t) = F^{-1}\left[\frac{R_{12}(jw)}{N}\right] \tag{8}$$

FIG. 38 is the inverse cross-correlation signal $r_{12}(t)$ corresponding to the cross-correlation signal $R_{12}(jw)$ shown in FIG. 48.

The inverse cross-correlation signal $r_{12}(t)$ is normalized according to equation (9) below.

$$p_{12}(t) = \frac{r_{12}(t)}{MAX_{func}} \tag{9}$$

The value $Max_{func}$ is defined in equation (10) below.

$$Max_{func} = \tag{10}$$

Figure 50:
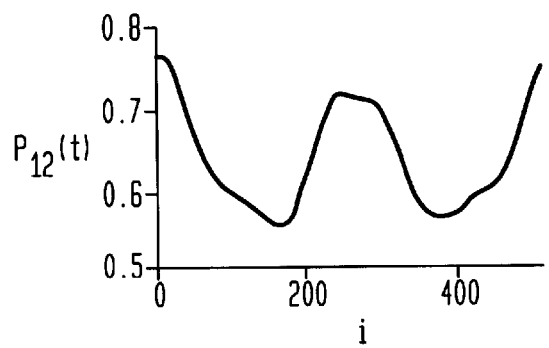

$Max_{12}$ if $Max_{22} < Max_{12}$ and to compare shape and amplitude $Max_{22}$ if $Max_{12} < Max_{22}$ and to compare shape and amplitude Square Root of $Max_{22} * Max_{11}$ if only to compare shape FIG. 50 shows the normalized signal $p_{12}(t)$ normalized using a $Max_{func}$ of 551.405 (square root of $Max_{22}$ multiplied by $Max_{11}$). The shape of the waveforms are only compared if there is a degradation in the SEM or the SEM is not matched to the SEM that measured the standardized wafer. The maximum value $p_{max}$ of the comparison waveform signal $p_{12}(t)$ is determined. The maximum value $p_{max}$ for the normalized signal $p_{12}(t)$ shown in FIG. 22 is 0767.

The processor determines whether the comparison waveform signal is within specification. For example, if the absolute value of the maximum value $p_{max}$ is greater than 0.9 and less than 1 ($0.90 < |p_{max}| < 1$), the wafer is considered acceptable. In a production line arrangement, one or more wafers may be tested to determine if an entire lot is acceptable. Otherwise, the lot may be rejected. Typically, acceptable wafers have been found to have a maximum value $p_{max}$ between 0.95 and 1 ($0.95 < |p_{max}| < 1$).

The lot or tools are indicated as passing if the maximum value $p_{max}$ is within the specified range. Otherwise, the maximum value $p_{max}$ is compared to data stored in database to determine what error has occurred and how the error may be corrected. The database includes data and/or instructions for modifying the production process to eliminate the errors.

The processor provides instructions to the tools, equipment, etc. using the data from the database to correct the errors. Alternatively, the information may be provided to an operator via a user interface (not shown). The operator makes adjustments to the manufacturing process in response to the information.

If there is no corresponding instructions for correcting the error, the error and the associated data are stored in the database for future analysis and comparison. For example, the wafer waveform signal $y_i(t)$, the comparison waveform signal $p_{12}$, and/or any of the other signals produced or used during the analysis of the wafer may be stored.

There now follows a more detailed description of the auto-correlation "by parts."

FIG. 51 shows how the amplitude modulated waveform signal is split into segmented parts numbered 1a–5a, followed by a second waveform of a second patterned feature beginning with 1b.

Figure 52C:
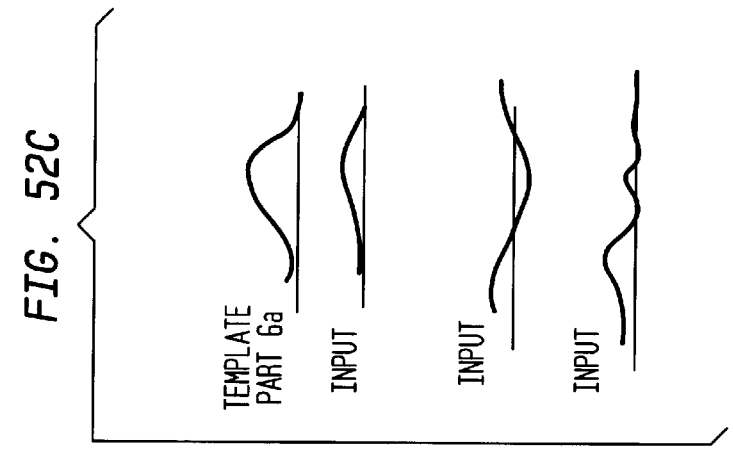
FIGS. 52A through 52C are graphs showing contoured shapes and scale, the templates, and the derived curve of FIG. 52C.
Figure 52B:
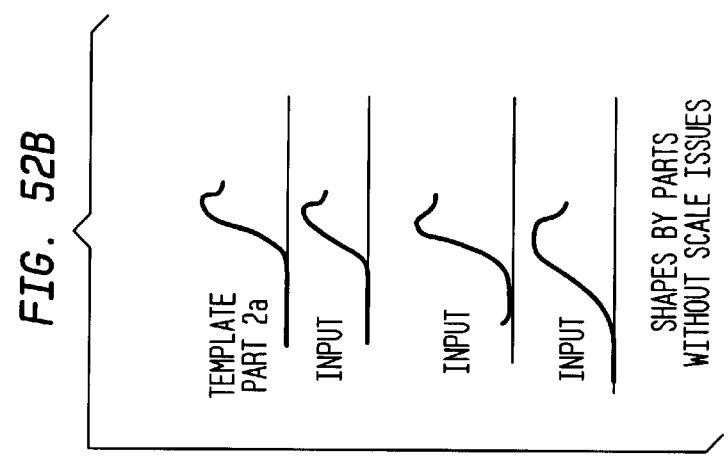
Figure 52A:
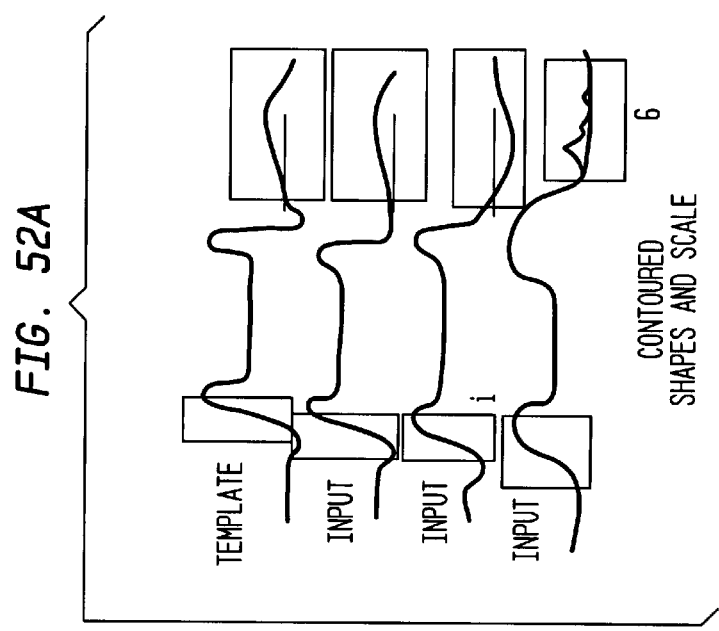

FIGS. 52A, 52B and 52C show the comparison of contoured shapes and scale (FIG. 52A) with the template using parts 2a and 6a. The curve is derived as shown in FIGS. 41B and 41C and consideration given to $d(int)/dx$, $d^2/dx$.... The input template and variables can be passed as signals to an EXCEL macro by pointing to a data directory. Input choices and analysis can be placed in a dialog box, as known to those skilled in the art. The output would be to a correlation value. FIG. 53 shows the same shape with a different scale, and FIG. 54 shows the same scale with different shapes. FIG. 55 shows a graph of the correlation by derivative that emphasizes the slope and transitions to have reduced tool differences. The amplitude can be normalized with a different emphasis on slope contribution to the shape. FIG. 56 shows the detection of specific shapes, such as the scum and focus variations, and emphasizes the difference in waveforms.

Figure 57:
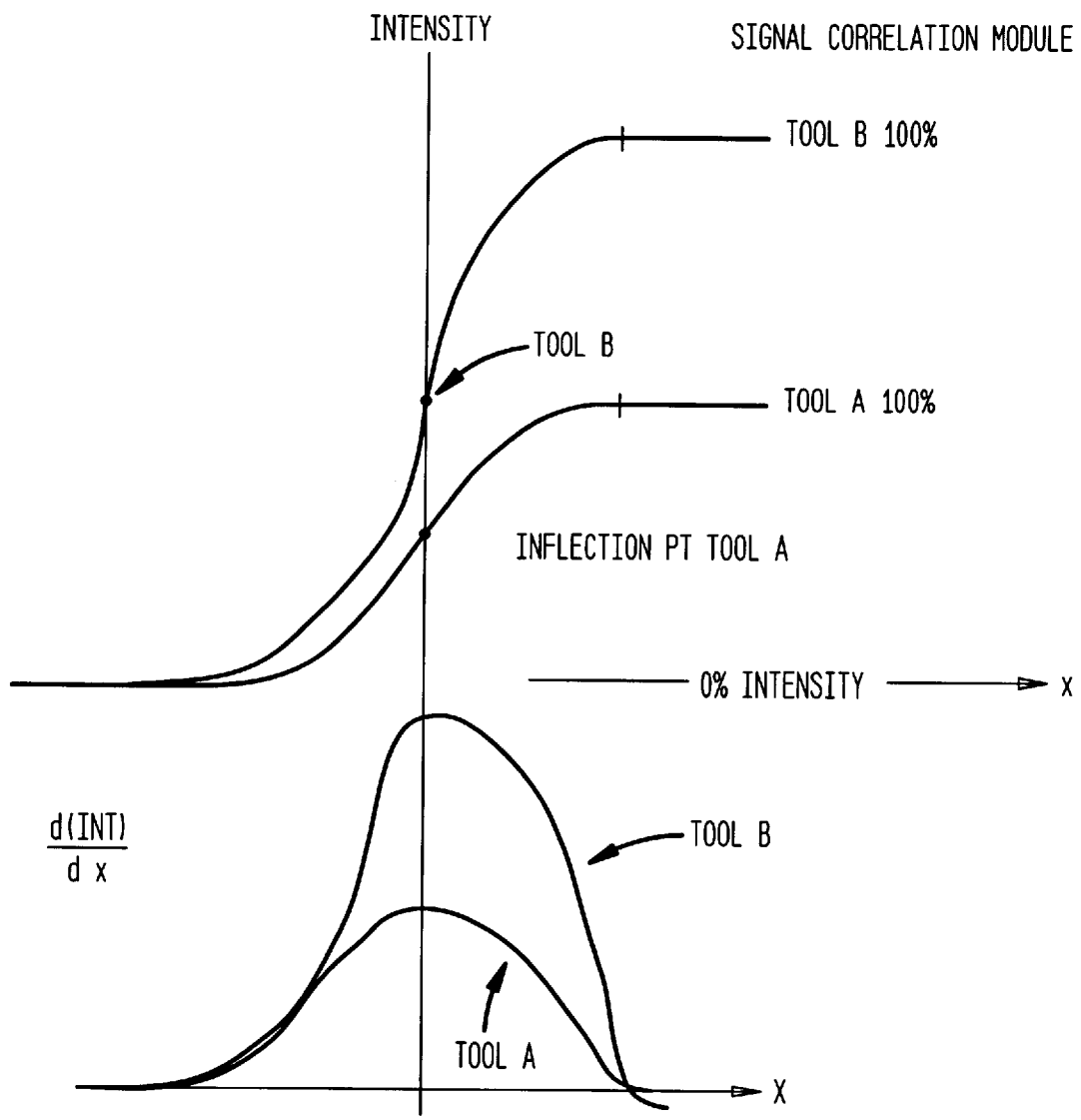
FIG. 57 is a graph illustrating a derivative correlation after normalization, where the amplitude accounts for variations in tool signal gain and similar sharpness.

FIG. 57 is a graph illustrating the derivative correlation after the normalization to $d(int)/dx$ where the amplitude accounts for variations in the tool (SEM) waveform signal gain that have similar sharpness.

The following data illustrates the type of signal correlation module and the various mechanics and normalization that can be used to develop the software for the present invention as described. The FFT corresponds to the Fast Fourier Transform.

Correlation Mechanics
$WF_1$ template waveform, whole signal & Partitioned & derivatives
$WF_N$ signal waveforms to be tested N=2,3,4 . . .
FFT ($WF_1$) (Conj FFT ($WF_1$)) Autocorrelation 1:1
FFT ($WF_2$) (Conj FFT ($WF_2$)) Autocorrelation N:N
Correlation 1:2 FFT (WF1) (Conj FFT ($WF_2$))
Inverse Autocorr. 1:1, Determine MAX 1:1, lag=0
Inverse Autocorr 2:2, Determine MAX 2:2, lag=0
Inverse Corr 1:2, Determine MAX 1:2, lage=output this value
Normalization:
To compare amplitude and shape Max 1:1 or Max 2:2 shape but not amplitude $$\sqrt{MAX11 \times MAX22}$$

Simple Correlation:

$$\frac{Max\ 12}{Max\ 11} \text{ or } \frac{Max\ 12}{Max\ 22} \text{ or } \frac{Max12}{\sqrt{MAX11 \times MAX22}}$$

Alternate: remove DC component from WF1 & WFN by subtracting WF mean before Auto correlation steps. (Tool offset gain)
Padding: to avoid end effects the initial WF should be padded with its mean value out to the next $2^N$ integer value. Smoothing the padded transition avoids extra frequence, components.

Signal Partition: to correlate shape apart from scale it is necessary to correlate the WF signal by parts.
Signal Derivatives: $d(lnt)/dx$, $d^2(lnt)/dx$ and partitions can be correlated to emphasize shape relations while removing tool differences in signal range (amplitude).

Many modifications and other embodiments of the invention will come to the mind of one skilled in the art having the benefit of the teachings presented in the foregoing descriptions and the associated drawings. Therefore, it is to be understood that the invention is not to be limited to the specific embodiments disclosed, and that the modifications and embodiments are intended to be included within the scope of the dependent claims.

That which is claimed is:

1. A method of monitoring a pattern transfer process in the manufacture of a semiconductor device comprising the steps of:

scanning across patterned features formed on a semiconductor layer to be etched for generating a first amplitude modulated waveform intensity signal;

sampling the first amplitude modulated waveform intensity signal to extract a first measurement population of critical dimension measurements;

etching the patterned features;

scanning across the etched patterned features for generating a second amplitude modulated waveform intensity signal;

sampling the second amplitude modulated waveform intensity signal to extract a second measurement population of critical dimension measurements; and cross-correlating the first and second populations of critical dimension measurements to obtain correlation values of the etching process.

2. A method according to claim 1, and further comprising the step of deriving a curve of outer line width and inner line spacing for the first and second amplitude modulated waveform intensity signals.

3. A method according to claim 1, and further comprising the step of:

forming a patterned photoresist layer over a nitride layer that has been formed over a silicon semiconductor layer;

etching the nitride layer to expose a pattern on the silicon semiconductor layer; and scanning across the etched nitride layer for generating the first amplitude modulated waveform intensity signal.

4. A method according to claim 3, and further comprising the steps of:

etching the patterned silicon semiconductor layer; and scanning across the etched silicon semiconductor layer for generating the second amplitude modulated waveform intensity signal.

5. A method according to claim 1, and further comprising the steps of:

sampling about ten to about twenty times across the patterned features in about five to about ten percent increments for obtaining the population of critical dimension measurements.

6. A method according to claim 1, and further comprising the step of:

generating the first and second amplitude modulated waveform signals with a scanning electron microscope.

7. A method according to claim 1, and further comprising the step of:

generating the first and second amplitude modulated waveform signals with a semiconductor stylus measurement tool.

8. A method of monitoring a pattern transfer process in the manufacture of a semiconductor device comprising the steps of:

scanning across patterned features of a semiconductor layer to be etched for generating a first amplitude modulated waveform intensity signal;

sampling the first amplitude modulated waveform intensity signal to extract a first measurement population of critical dimension measurements;

etching the patterned features;

scanning across the etched patterned features for generating a second amplitude modulated waveform intensity signal;

sampling the second amplitude modulated waveform intensity signal to extract a second measurement population of critical dimension measurements;

cross-correlating the first and second populations of critical dimension measurements to obtain correlation values of the etching process; and storing the correlation values of the etching process within a database for use in monitoring subsequent etching on other samples of other semiconductor layers to be etched.

9. A method according to claim 8, and further comprising the step of deriving a curve of outer line width and inner line spacing for the first and second amplitude modulated waveform intensity signals.

10. A method according to claim 8, and further comprising the steps of:

forming a patterned photoresist layer over a nitride layer that has been formed over a silicon semiconductor layer;

etching the nitride layer to expose a pattern on the silicon semiconductor layer; and scanning across the etched nitride layer for generating the first amplitude modulated waveform intensity signal.

11. A method according to claim 10, and further comprising the step of:

etching the patterned silicon semiconductor layer; and scanning across the etched silicon semiconductor layer for generating the second amplitude modulated waveform intensity signal.

12. A method according to claim 8, and further comprising the step of:

sampling about ten to about twenty times across the patterned features in about five to about ten percent increments for obtaining the population of critical dimension measurements.

13. A method according to claim 8, and further comprising the step of:

generating the amplitude modulated waveform signal with a scanning electron microscope.

14. A method according to claim 8, and further comprising the step of:

generating the first and second amplitude modulated waveform signals with a semiconductor stylus measurement tool.

15. A method of monitoring a pattern transfer process in the manufacture of a semiconductor surface comprising the steps of:

scanning across patterned features of a semiconductor layer to be etched for generating a first amplitude modulated waveform intensity signal;

sampling the first amplitude modulated waveform intensity signal to extract a first measurement population of critical dimension measurements;

etching the patterned features;

scanning across the etched patterned features for generating a second amplitude modulated waveform intensity signal;

sampling the second amplitude modulated waveform intensity signal to extract a second measurement population of critical dimension measurements;

cross-correlating the first and second plurality of critical dimension measurements to obtain correlation values of the etching process;

storing the correlation values of the etching process within a database;

scanning a second semiconductor layer to be etched for generating an amplitude modulated waveform intensity signal of the second semiconductor layer to be etched; and determining anticipated etching process results for the second semiconductor layer based on the stored correlation values.

16. A method according to claim 15, and further comprising the step of deriving a curve of outer line width and inner line spacing for the first and second amplitude modulated waveform intensity signals.

17. A method according to claim 15, and further comprising the steps of:

forming a patterned photoresist layer over a nitride layer that has been formed over a silicon semiconductor layer;

etching the nitride layer to expose a pattern of the silicon semiconductor layer; and scanning across the etched nitride layer for generating the first amplitude modulated waveform intensity signal.

18. A method according to claim 17, and further comprising the steps of:

etching the patterned silicon semiconductor layer; and scanning across the etched silicon semiconductor layer for generating the second amplitude modulated waveform intensity signal.

19. A method according to claim 15, and further comprising the step of:

sampling about ten to about twenty times across the patterned features in about five to about ten percent increments for obtaining the population of critical dimension measurements.

20. A method according to claim 15, and further comprising the step of:

generating the amplitude modulated waveform signal with a scanning electron microscope.

21. A method according to claim 15, and further comprising the step of:

generating the first and second amplitude modulated waveform signals with a semiconductor stylus measurement tool.

* * * * *